United States Patent
Katori

(10) Patent No.: US 6,307,731 B1
(45) Date of Patent: Oct. 23, 2001

(54) DIELECTRIC CAPACITOR AND MEMORY AND METHOD OF MANUFACTURING THE SAME

(75) Inventor: Kenji Katori, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/584,140

(22) Filed: May 31, 2000

(30) Foreign Application Priority Data

Jun. 2, 1999 (JP) .................................................. 11-155391

(51) Int. Cl.$^7$ ........................... H01G 4/008; H01G 4/06; H01L 29/76; H01L 29/94; H01L 27/08
(52) U.S. Cl. ........................ 361/305; 361/311; 257/295; 257/296; 257/306
(58) Field of Search .................... 361/306.3, 311–313, 361/305; 257/306, 307, 308, 309, 310, 295, 296; 438/243–253, 396–399

(56) References Cited

U.S. PATENT DOCUMENTS 6,011,284 * 1/2000 Katori et al. ........................ 257/295

* cited by examiner

*Primary Examiner*—Anthony Dinkins
(74) *Attorney, Agent, or Firm*—Ronald P. Kananen; Rader, Fishman & Grauer

(57) ABSTRACT

Provided are a dielectric capacitor, in which micorfabrication is easily performed, a memory and a method of manufacturing the dielectric capacitor and the memory.

A bottom electrode, a dielectric film and a top electrode are sequentially provided on a substrate portion. The bottom electrode comprises an adhesive layer including IrHf, a precious metal layer including Ir, an oxygen inclusion layer including IrHfO and, a precious metal layer including Ir in sequence on the substrate portion. The top electrode comprises, a precious metal layer including Ir and an oxygen inclusion layer including IrHfO in sequence on the dielectric film. Since platinum is not used for the top electrode and the bottom electrode, microfabrication thereof is facilitated Further, the top electrode is deposited before crystallizing or crystal growing the dielectric film, and thereby the top electrode and the bottom electrode can be processed by etching. As a result, etching can be performed on its smooth surface, allowing easier microfabrication.

25 Claims, 9 Drawing Sheets

DIELECTRIC CAPACITOR AND MEMORY AND METHOD OF MANUFACTURING THE SAME

BACKGROUND OF THE INVENTION

1. Field of the Invention

The present invention relates to a dielectric capacitor and a memory, which are supported by a substrate portion and in which a first electrode, a dielectric film and a second electrode are formed successively on the substrate portion and a method for manufacturing the same.

2. Description of the Related Art

A ferroelectric memory is a rapidly rewrittable, non-volatile memory by means of rapid polarization inversion and its residual polarization of a ferroelectric film. Conventionally, as the ferroelectric memory, a memory in which a dielectric capacitor and a transistor are arranged in parallel with the direction along which a base surface extends is known, for example. In such a ferroelectric memory, for example, the dielectric capacitor has a construction in which an adhesive layer made of titanium (Ti), a bottom electrode layer made of platinum (Pt), a ferroelectric film made of a bismuth (Bi) inclusion layer structure oxide or PZT which is a solid solution of $PbTiO_3$ and $PbZrO_3$, and a top electrode layer made of platinum are stacked successively on a base sandwiching an insulating layer in between.

Further, in order to increase information recording density, a so-called stack type capacitor in which a transistor and a ferroelectric capacitor are stacked on the base is known. In the ferroelectric memory, for example, the transistor and the bottom electrode of the ferroelectric capacitor are electrically coupled through a plug layer made of silicon (Si) and also an anti-diffusion layer for preventing diffusion of a chemical element on the bottom electrode of the ferroelectric capacitor is provided. The anti-diffusion layer is for preventing conductivity of the bottom electrode from being lost when silicon is diffused from the plug layer onto the bottom electrode and oxidized in the top layer portion. The anti-diffusion layer is also for preventing a capacitor characteristic from being deteriorated significantly when the silicon is diffused onto the ferroelectric film. Both are caused by thermal annealing at a high temperature as approximately 600–800° C. in forming the ferroelectric film. As such a ferroelectric memory, for example, the anti-diffusion layer including iridium (Ir), hafnium (Hf), and oxygen (O), which is formed on the bottom electrode has been conventionally reported (Refer to Japanese Unexamined Patent Application Publication No. Hei 10-242409.)

However, in the conventional ferroelectric capacitor, since platinum is used as an electrode material, a problem exists such that micromachining is difficult. Thus, there is a need for use of another electrode material which is easy to process. However, since the top electrode is particularly formed in such a manner that a bottom electrode, a ferroelectric film and a top electrode are sequentially stacked on a substrate, it gives a great influence on the bottom electrode and the dielectric film in the manufacturing process. In another words, requirements are needed for the electrode material, but the conventional material is not satisfactory in this respect.

For example, when precious metal other than platinum or gold (Au) is used for the bottom electrode including the anti-diffusion layer, the characteristics of the ferroelectric film deteriorate due to hydrogen annealing for recovering the functionality of the transistor. It is considered that this deterioration is influenced by the hydrogen annealing which reduces precious metal oxide produced at the time of forming the ferroelectric film. In order to prevent the deterioration, it may be effective that the precious metal oxide produced at the time of forming ferroelectric film is reduced before the hydrogen annealing. Thus, a material which can obtain a great characteristic by heat processing in an inert-gas atmosphere is desired for comprising the top electrode.

Further, conventionally, a ferroelectric capacitor is formed by depositing the top electrode after crystals of the ferroelectric film have sufficiently grown and then processing by etching. However, in many cases, the pure reactive ion etching (RIE) method can not be applied for the top electrode and the ferroelectric film, and therefore sputter etching also takes place in the etching processing. In that case, if the surface roughness is large, the surface roughness is transferred to the substrate. Thus, desirably the etching takes place when the surface condition is still favorable before the crystals of the ferroelectric film have grown. For the top electrode, required is a material which can obtain favorable characteristics even when the top electrode is deposited and crystals are grown before crystals of the ferroelectric film are grown. Among conventional electrode materials, only platinum can be used for depositing the top electrode and causing the crystals to be grown in a condition where crystallinity of the ferroelectric film is low. However, the ferroelectric capacitor manufactured in this method is shorted completely by the hydrogen annealing for recovering the functionality of the transistor. Therefore, it is difficult to put it into practical use.

SUMMARY OF THE INVENTION

The present invention has been achieved in view of above problems, and it is an object of the present invention to provide a dielectric capacitor and a memory, which can be easily micromachined, and a method for manufacturing the same.

A dielectric capacitor according to the present invention is supported by a substrate portion, wherein a first electrode, a dielectric film and a second electrode are formed sequentially on of the substrate portion. This dielectric capacitor includes the second electrode which comprises a second electrode oxygen inclusion layer including an oxygen inclusion material made of at least one selected from a precious metal element group consisting of platinum (Pt), iridium (Ir), ruthenium (Ru), rhodium (Rh) and palladium (Pd), at least one selected from a transition metal element group consisting of hafnium (Hf), tantalum (Ta), Zirconium (Zr), niobium (Nb), vanadium (V), molybdenum (Mo), tungsten (W) and a rare-earth element, and oxygen (O). The composition formula of the oxygen inclusion material is expressed by $M_{Ia}M_{IIb}O_c$, where an element in the precious metal element group is $M_I$ and an element in the transition metal element group is $M_{II}$, and its composition range is $90 \geq a \geq 4$, $15 \geq b \geq 2$, $c \geq 4$, $a+b+c=100$ in atom %.

A memory according to the present invention comprises a dielectric capacitor which is supported by a substrate portion, and on which a first electrode, a dielectric film and a second electrode are formed sequentially on the side of the substrate portion. The second electrode comprises a second electrode oxygen inclusion layer including an oxygen inclusion material, made of at least one selected from a precious metal element group consisting of platinum (Pt), iridium (Ir), ruthenium (Ru), rhodium (Rh) and palladium (Pd), at least one selected from a transition metal element group consisting of hafnium (Hf), tantalum (Ta), zirconium (Zr), niobium (Nb), vanadium (V), molybdenum (Mo), tungsten (W) and a rare-earth element, and oxygen (O). The composition formula of the oxygen inclusion material is expressed by $M_{Ia}M_{IIb}O_c$, where an element in the precious metal element group is $M_I$ and an element in the transition metal element group is $M_{II}$, and its composition range is $90 \geq a \geq 4$, $15 \geq b \geq 2$, $c \geq 4$, $a+b+c=100$ in atom %.

A method of manufacturing a dielectric capacitor according to the present invention is used for manufacturing a dielectric capacitor which is supported by a substrate portion and in which a first electrode, a dielectric film and a second electrode are formed sequentially on the substrate portion. This manufacturing method comprises a step of forming the second electrode, which includes a step of depositing a first layer for the second electrode by using an oxygen inclusion material made of at least one selected from a precious metal element group consisting of platinum (Pt), iridium (Ir), ruthenium (Ru), rhodium (Rh) and palladium (Pd), at least one selected from a transition metal element group consisting of hafnium (Hf), tantalum (Ta), zirconium (Zr), niobium (Nb), vanadium (V), molybdenum (Mo), tungsten (W) and a rare-earth element, and oxygen (O). The composition formula of the oxygen inclusion material is expressed by $M_{Ia}M_{IIb}O_c$, where an element in the precious metal element group is $M_I$ and an element in the transition metal element group is $M_{II}$, and its composition range is $90 \geq a \geq 4$, $15 \geq b \geq 2$, $c \geq 4$, $a+b+c=100$ in atom %.

A method of manufacturing a memory is for manufacturing a memory having a dielectric capacitor which is supported by a substrate portion and in which a first electrode, a dielectric film and a second electrode are formed sequentially on the substrate portion. This manufacturing method comprises a step for forming the second electrode which includes a step of depositing a first layer for the second electrode using an oxygen inclusion material made of at least one selected from a precious metal element group consisting of platinum (Pt), iridium (Ir), ruthenium (Ru), rhodium (Rh) and palladium (Pd), at least one selected from a transition metal element group consisting of hafnium (Hf), tantalum (Ta), zirconium (Zr), niobium (Nb), vanadium (V), molybdenum (Mo), tungsten (W) and a rare-earth element, and oxygen (O). The composition formula of the oxygen inclusion material is shown by $M_{Ia}M_{IIb}O_c$, where an element in the precious metal element group is $M_I$ and an element in the transition metal element group is $M_{II}$, and its composition range is $90 \geq a \geq 4$, $15 \geq b \geq 2$, $c \geq 4$, $a+b+c=100$ in atom %.

Since an oxygen including material $M_{Ia}M_{IIb}O_c$ is used for the second electrode in the dielectric capacitor according to the present invention, its precision process is made easy.

The memory according to the present invention is equipped with the dielectric capacitor of the present invention.

In the method of manufacturing the dielectric capacitor according to the present invention, in the process of forming the second electrode, the oxygen including material $M_{Ia}M_{IIb}O_c$ is used to form the first layer of the second electrode.

The method of manufacturing the memory according to the present invention includes steps of the method of manufacturing the dielectric capacitor according to the present invention.

Other and further objects, features and advantages of the invention will appear more fully from the following description.

DETAILED DESCRIPTION OF THE PREFERRED EMBODIMENTS

The embodiments of this invention will be described in further detail with reference to the accompanying drawings.

First Embodiment

Figure 1:
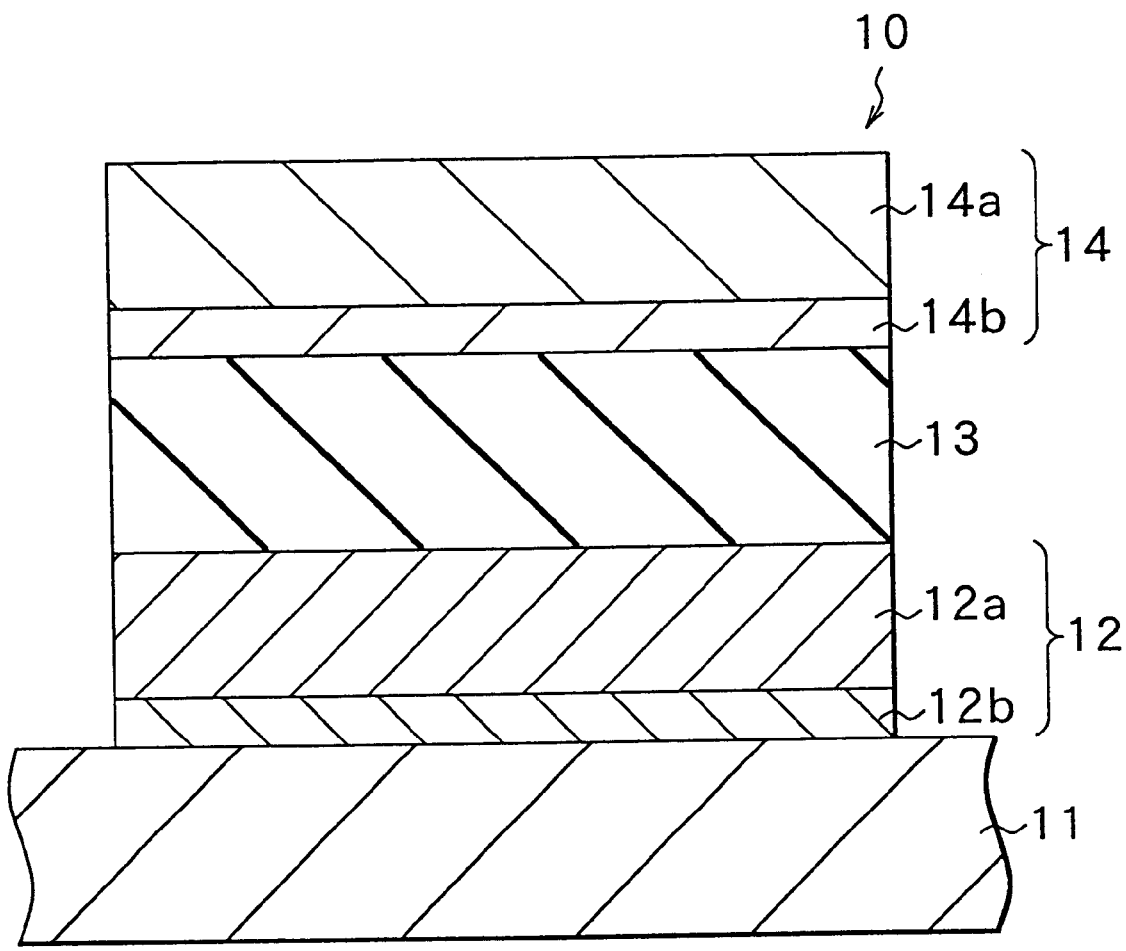
FIG. 1 is a cross section showing a construction of a dielectric capacitor according to a first embodiment according to the present invention.

FIG. 1 shows a construction of a dielectric capacitor 10 according to a first embodiment of the present invention. The dielectric capacitor 10 is constructed on one surface of a substrate portion 11, for example, made of silicon, an insulating material such as silicon dioxide ($SiO_2$) or the like by stacking a bottom electrode 12, which is a first electrode, a dielectric film 13, a top electrode 14, which is a second electrode, in that order on the substrate portion 11. That is, the dielectric capacitor 10 is supported by the substrate portion 11, and the bottom electrode 12 and the top electrode 14 are connected to the dielectric film 13, respectively.

The bottom electrode 12 includes a precious metal layer 12a, which is 200 nm in thickness, and an adhesive layer 12b, which is 20 nm in thickness and is provided between the precious metal layer 12a and the substrate portion 11, for example. The precious metal layer 12a includes mainly at least one selected from a precious metal element group consisting of platinum, iridium, ruthenium (Ru), rhodium (Rh) and palladium (Pd), for example. Elements included in the precious metal element group are shown by element symbols in Table 1.

TABLE 1

| Precious Metal Element Group | Pt, Ir, Ru, Rh, Pd |
|---|---|
| Transition Metal Element Group | Hf, Ta, Zr, Nb, V, Mo, W, rare-earth element |

The adhesive layer 12b increases adhesion to the substrate portion 11, and includes mainly at least one selected from an adhesive layer composition element group consisting of titanium, zirconium, hafnium, tantalum, niobium, chromium (Cr), molybdenum and tungsten, for example.

The dielectric film 13 is approximately 170 nm in thickness, for example, and is composed of a ferroelectric mainly including layer structure oxide containing bismuth. The inclusion rate of the layer structure oxide therein is preferably 85 vol. % or higher. This is because favorable ferroelectric characteristics can not be obtained if the inclusion rate is lower than the rate. This layer structure oxide is preferably composed of, for example, bismuth, at least one selected, as a first element, from a group consisting of strontium (Sr), calcium (Ca) and barium (Ba), at least one selected, as a second element, from a group consisting of tantalum (Ta) and niobium (Nb), and oxygen and formulated in the composition formula shown in Chemical Formula 1. Also, its composition range is preferably $2.50 \geq x \geq 1.70$, $1.20 \geq y \geq 0.60$, and $-1.00 \geq z \geq 1.00$.

$$Bi_x(Sr, Ca, Ba)_y(Ta, Nb)_2O_{9+z}$$ Chemical Formula 1

It is because favorable ferroelectric characteristics can be obtained from such a layer structure oxide. In view of a stoichiometry composition, its crystal structure of the layer structure oxide is the perovskite type in which a layer corresponding to $[Bi_2O_2]^{2+}$ and a layer corresponding to $[(Sr, Ca, Ba)_1 (Ta, Nb)_2O_7]_{2-}$ are stacked alternately.

The top electrode 14 includes an, oxygen inclusion layer 14a, which is approximately 200 nm in thickness comprising a second electrode oxygen inclusion layer, and a precious metal layer 14b which is approximately 20 nm in thickness comprising a second electrode precious metal layer provided between the oxygen inclusion layer 14a and the dielectric film 13, for example. For example, the oxygen inclusion layer 14a mainly includes an oxygen inclusion material consisting of at least one selected from the precious metal element group shown in Table 1, at least one selected from a transition metal element group consisting of hafnium, tantalum, zirconium (Zr), niobium, vanadium (V), molybdenum (Mo), tungsten (W) and a rare-earth element, and oxygen. The elements in the transition metal element group are also shown by elements symbols in Table 1.

The following Chemical Formula 2 is the composition formula of the oxygen inclusion material, where an element in the precious metal element group is $M_I$ and an element in the transition metal element group is $M_{II}$. Its composition range is preferably $90 \geq a \geq 4$, $15 \geq b \geq 2$, $c \geq 4$, $a+b+c=100$ in atom %. When the precious metal element $M_I$ exceeds this range, the stable microlite condition cannot be obtained. When the precious metal element $M_I$ is below the range, it causes larger electrical resistance and the unstable crystal condition. Also, in a case where the composition of the transition metal element $M_{II}$ and oxygen is within the range, the stable microlite condition can be obtained.

$$M_{Ia}M_{IIb}O_c$$ Chemical Formula 2

$M_I$: an element in the precious metal element group
$M_{II}$: an element in the transition metal element group The precious metal layer 14b includes mainly at least one selected from the precious metal group shown in Table 1, for example. The precious metal layer 14b is not a required component. However, preferably the precious metal layer 14b is included because the precious metal layer 14b provides more stable characteristics. The precious metal layer 14b may include a precious metal element among elements in the precious metal element group different from the one in the oxygen inclusion layer 14a. However, preferably the precious metal layer 14b is composed so as to include the same precious metal element as that in the oxygen inclusion layer 14a. As a result, it is possible to simplify its manufacturing device and improve the productivity.

Figure 2:
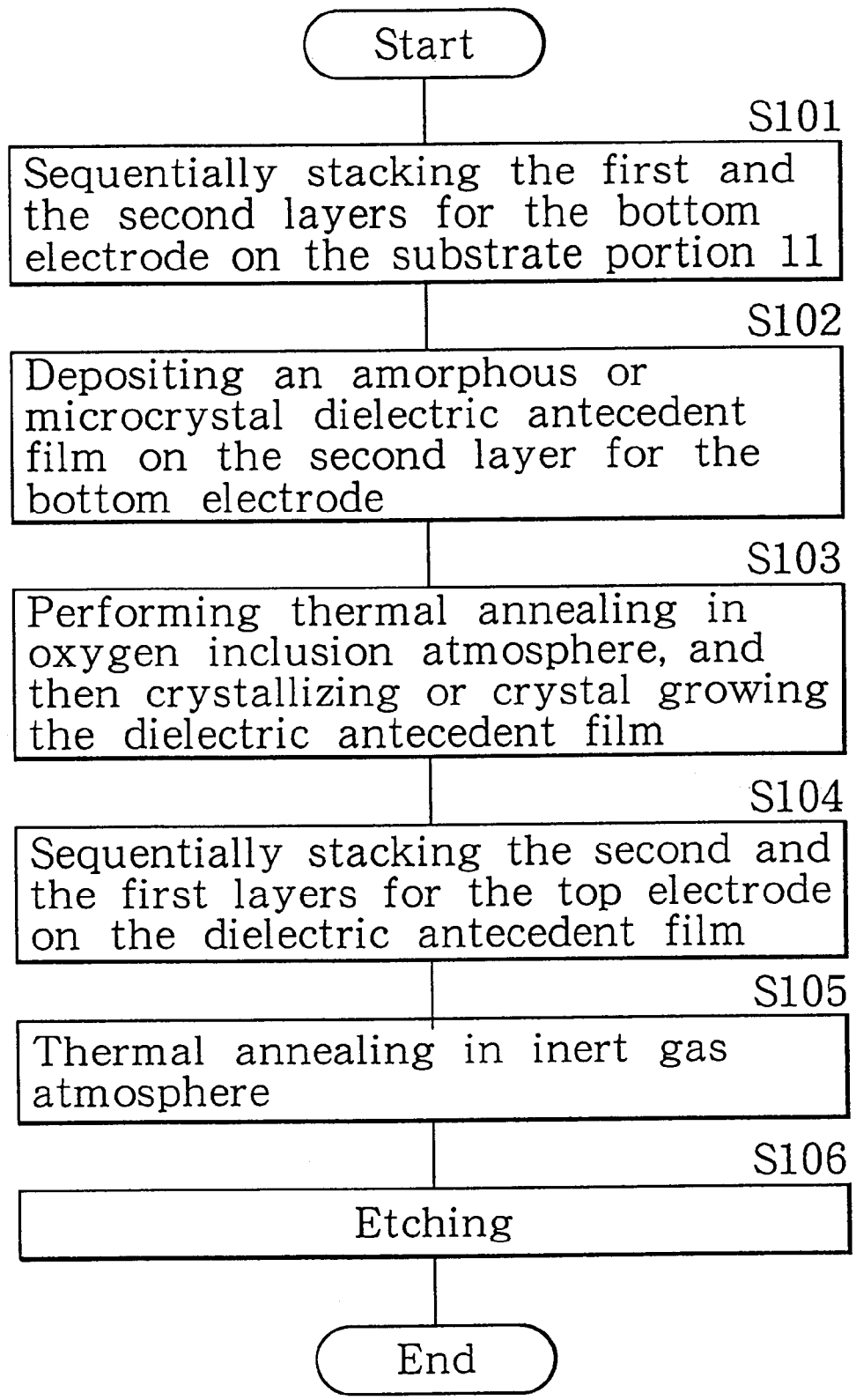
FIG. 2 is a flow chart showing steps of the manufacturing method of the dielectric capacitor shown in FIG. 1.

The dielectric capacitor 10 can be manufactured as follows:

FIG. 2 shows steps of the manufacturing process of the dielectric capacitor 10. First of all, as a step for forming a first electrode, a first layer for the bottom electrode is deposited approximately 20 nm in thickness by using at least one selected from the adhesive layer composition element group described above on the substrate portion 11 by the sputtering method, for example. A second layer for the bottom electrode is formed approximately 200 nm in thickness by using at least one selected from the precious metal element group described above on the first layer (Step S101). The first layer is to construct the adhesive layer 12b, and the second layer is to construct the precious metal layer 12a.

Next, as a step for forming the dielectric film 13, an amorphous or a microlite dielectric antecedent film including the layer structure oxide described above is deposited on the second layer for the bottom electrode by the sol-gel method, for example (Step S102.) Specifically, for example, a sol-gel solution including bismuth and the first and the second elements described above is applied on the second layer by the spin-coat method, and, then, rapid thermal annealing (RTA) is performed in an oxygen inclusion atmosphere. Subsequently, as a step for forming the dielectric film 13, thermal annealing is performed at a temperature of approximately 750° C. in an oxygen inclusion atmosphere to crystallize or crystal grow the dielectric antecedent film, for example (Step S103.)

After the dielectric antecedent film is crystallized or crystal grown, a second layer for the top electrode is deposited thereon approximately 20 nm in thickness by using at least one selected from the precious metal element group described above by the sputtering method, for example. On the second layer, a first layer for the top electrode including oxygen is deposited approximately 200 nm in thickness by using the oxygen inclusion material $M_{Ia}M_{IIb}O_c$ described above (Step S104.) The second layer is to construct the precious metal layer 14b, and the first layer is to construct the oxygen inclusion layer 14a.

After the second and the first layers for the top electrode are deposited, thermal annealing is performed in an inert gas atmosphere (Step S105). As the inert gas, either rare gas, such as nitrogen gas ($N_2$), argon (Ar) gas, or helium (He) gas, or mixed gas in which two or more gases among the aforementioned rare gases are mixed, can be used. Then, the first and the second layers for the top electrode, the dielectric antecedent film, and the second and the first layers for the bottom electrode are processed in a predetermined form by etching, respectively (Step S106). Since the first layer for the top electrode is formed of the oxygen inclusion material $M_{Ia}M_{IIb}O_c$, here, its micromachining is easy to perform. Accordingly, the dielectric capacitor 10 shown in FIG. 1 is formed.

Figure 3:
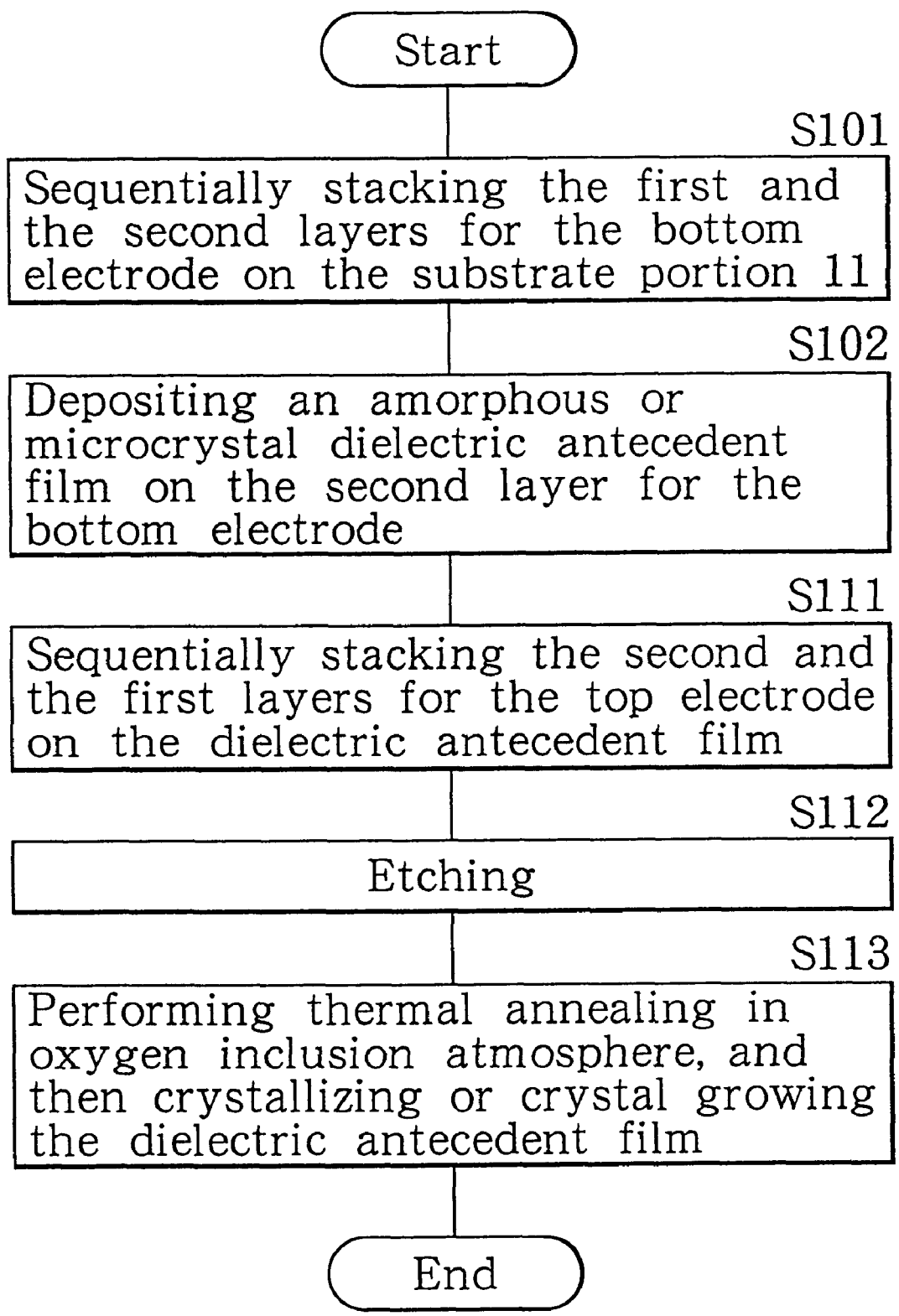
FIG. 3 is a flow chart showing steps of another manufacturing method of the dielectric capacitor shown in FIG. 1.

Further, the dielectric capacitor 10 may be also manufactured as follows:

FIG. 3 shows steps of another manufacturing process of the dielectric capacitor 10. First of all, for example, the first and the second layers for the bottom electrode are deposited and stacked sequentially on the substrate portion 11 (Step S101) in the same manner as the manufacturing method described above, and thereafter the amorphous or microlite dielectric antecedent film is deposited thereon (Step S102).

Next, for example, in the same manner as the manufacturing method described above, the second and the first layers for the top electrode are deposited and stacked sequentially on the dielectric antecedent film (Step S111). Then, for example, the first and the second layers for the top electrode, the dielectric antecedent film, and the second and the first layers for the bottom electrode are processed in a predetermined form by etching, respectively (Step S112). After processed by etching, in the same manner as the manufacturing method described above, for example, the dielectric antecedent film is crystallized or crystal grown (Step S113). As a result, the dielectric capacitor 10 shown in FIG. 1 is formed.

That is, before the electric antecedent film is crystallized or crystal grown, the second and the first layers for the top electrode may be formed and processed by etching, respectively. By this process, the surface of the first layer for the top electrode becomes smoother, compared to the case where the dielectric antecedent film is crystallized or crystal grown before etching. Consequently, the surface of the substrate portion 11 exposed by etching assumes a favorable condition.

The dielectric capacitor 10 operates as follows:

In the dielectric capacitor 10, when voltage is applied between the top electrode 14 and the bottom electrode 12, polarization occurs in the dielectric film 13. Since the top electrode 14 is composed by using the oxygen inclusion material $M_{Ia}M_{IIb}O_c$, the dielectric capacitor 10 displays favorable conditions even if the second and the first layers for the top electrode are deposited, respectively, and, then, thermal annealing is performed thereon in an inert gas atmosphere. Further, the dielectric capacitor 10 displays favorable conditions even if the second and the first layers for the top electrode are deposited before the dielectric antecedent film is crystallized or crystal grown.

Thus, according to this embodiment, since the top electrode 14 is formed by using the oxygen inclusion material $M_{Ia}M_{IIb}O_c$, microfabrication of the top electrode 14 becomes easier, which improves the possibility to scale down the device. Further, the favorable condition can be obtained even when the first layer for the top electrode is formed before the dielectric antecedent film is crystallized or crystal grown. Hence, the surface of the substrate portion 11 exposed by etching in processing can be made smooth, and the microfabrication becomes easier.

Further, the precious metal layer 14b is provided between the oxygen inclusion layer 14a and the dielectric film 13, and therefore the more even and stable characteristics can be obtained.

Figure 4:
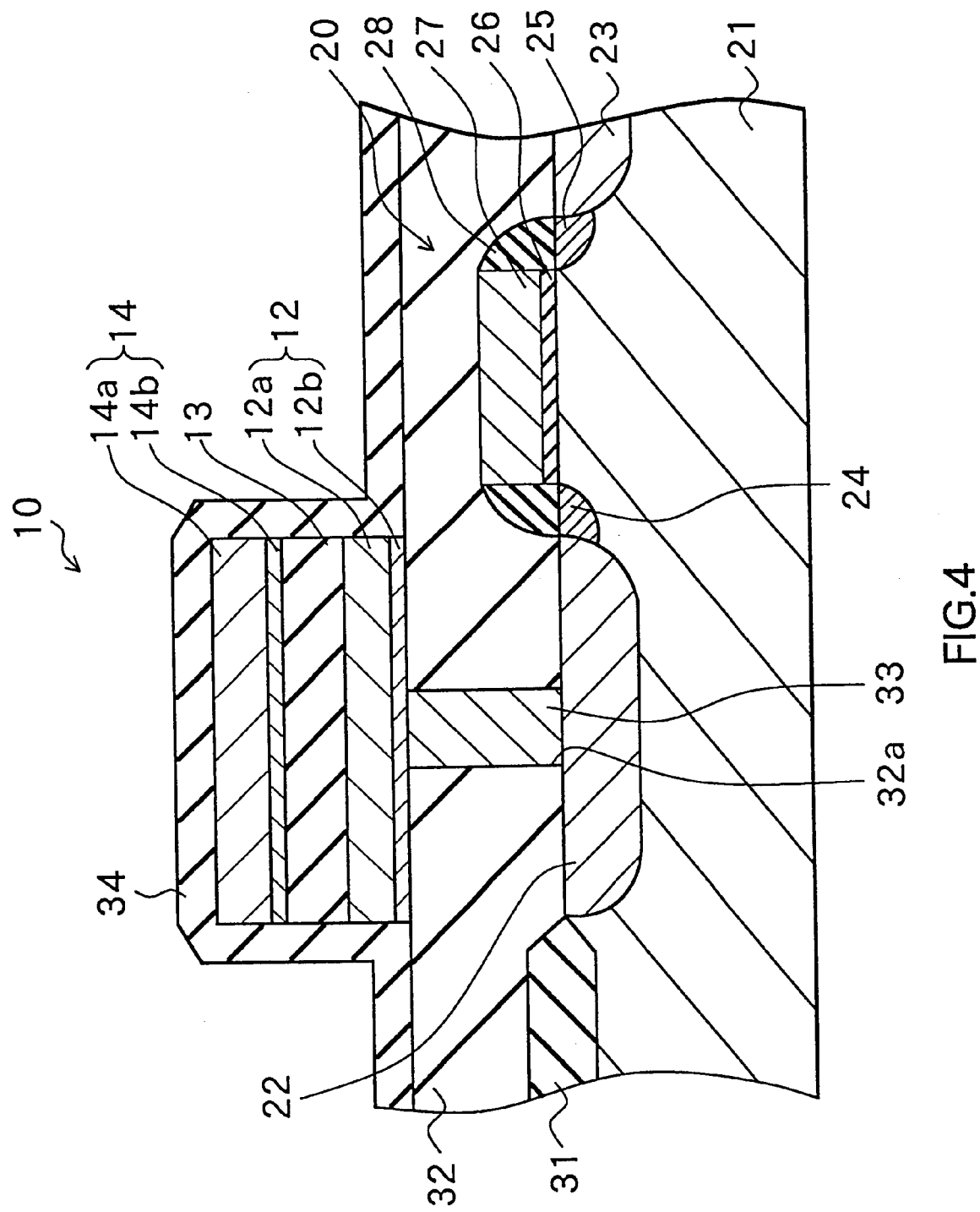
FIG. 4 is a cross section showing a construction of a memory in which the dielectric capacitor shown in FIG. 1 is employed.

The dielectric capacitor 10 is used as a part of a memory, for example, as follows:

FIG. 4 shows one example of the memory with the dielectric capacitor. The memory is composed of the dielectric capacitor 10 according to this embodiment and a transistor 20 for switching. The transistor 20 has, for example, a source region 22 made of an $n^+$ layer, and a drain region 23 made of an $n^+$ layer, which are formed with space therebetween on the surface of a substrate 21 made of p-type silicon. On the surface of the substrate 21 between the source region 22 and the drain region 23, LDD regions 24 and 25 made of an $n^-$ layer with space therebetween are formed adjacent to the source region 22 and the drain region 23, respectively. A gate electrode 27 is formed, as a word line, through a gate insulating film 26 on the surface of the substrate 21, between the source region 22 and the drain region 23. A gate side wall 28 made of an insulating material is formed on the side surface portion of the gate electrode 27. Around the transistor 20, a field film oxide 31 for separating devices is formed on the surface of the substrate 21.

The dielectric capacitor 10 is formed on the transistor 20 through a layer insulating film 32. That is, the bottom electrode 12, the dielectric film 13 and the top electrode 14 are stacked sequentially through the layer insulating film 32. The source region 22 of the transistor 20 and the bottom electrode 12 (specifically, the adhesive layer 12b) of the dielectric capacitor 10 are electrically coupled through a contact hole 32a provided in the layer insulating film 32. A plug layer 33 made of polycrystalline silicon, tungsten, or the like is embedded in the contact hole 32a. That is, the layer insulating film 32 and the plug layer 33 correspond to the substrate portion 11, here. An insulating layer 34 is formed on the dielectric capacitor 10.

The memory can be manufactured as follows:

First of all, the transistor 20 is formed on the surface of the substrate 21 by an appropriate method, and, then, the layer insulating film 32 is formed thereon by the CVD (chemical vapor deposition) method or the like. Next, the contact hole 32a is formed by selectively etching the layer insulating film 32 to expose the source region 22 of the transistor 20. Then, the plug layer 33 is embedded in the contact hole 32, and the plug layer 33 is connected to the source region 22. After that, the dielectric capacitor 10 is formed on the plug layer 33 in the manner described above, and the bottom electrode 12 is connected to the plug layer 33. After the dielectric capacitor 10 is formed, hydrogen annealing is performed thereon in a hydrogen inclusion atmosphere to recover the functionality of the transistor 20. As described above, since the top electrode 14 is formed by using the oxygen inclusion material $M_{Ia}M_{IIb}O_c$, the functionality of the dielectric capacitor 10 is not lost by the hydrogen annealing even if the dielectric antecedent film is crystallized or crystal grown after forming the first layer of the top electrode. Then, the insulating film 34 is formed on the surface by the CVD method or the like. As a result, the memory shown in FIG. 4 is formed.

The memory operates as follows:

In this memory, applying voltage to the gate electrode 27 of the transistor 20 switches the transistor 20 to "ON", for example, and energizes between the source region 22 and the drain region 23. As a result, the dielectric capacitor 10 is energized through the plug layer 33, and voltage is applied between the top electrode 14 and the bottom electrode 12. Applying voltage to the dielectric capacitor 10 causes polarization in the dielectric film 13. By this polarization, "1" or "0" data is stored or read out.

According to the memory and the method of manufacturing the same, since the dielectric capacitor 10 according to this embodiment is used, favorable characteristics can be obtained as well as easier microfabrication improving condition for scaling down the device.

Second Embodiment

Figure 5:
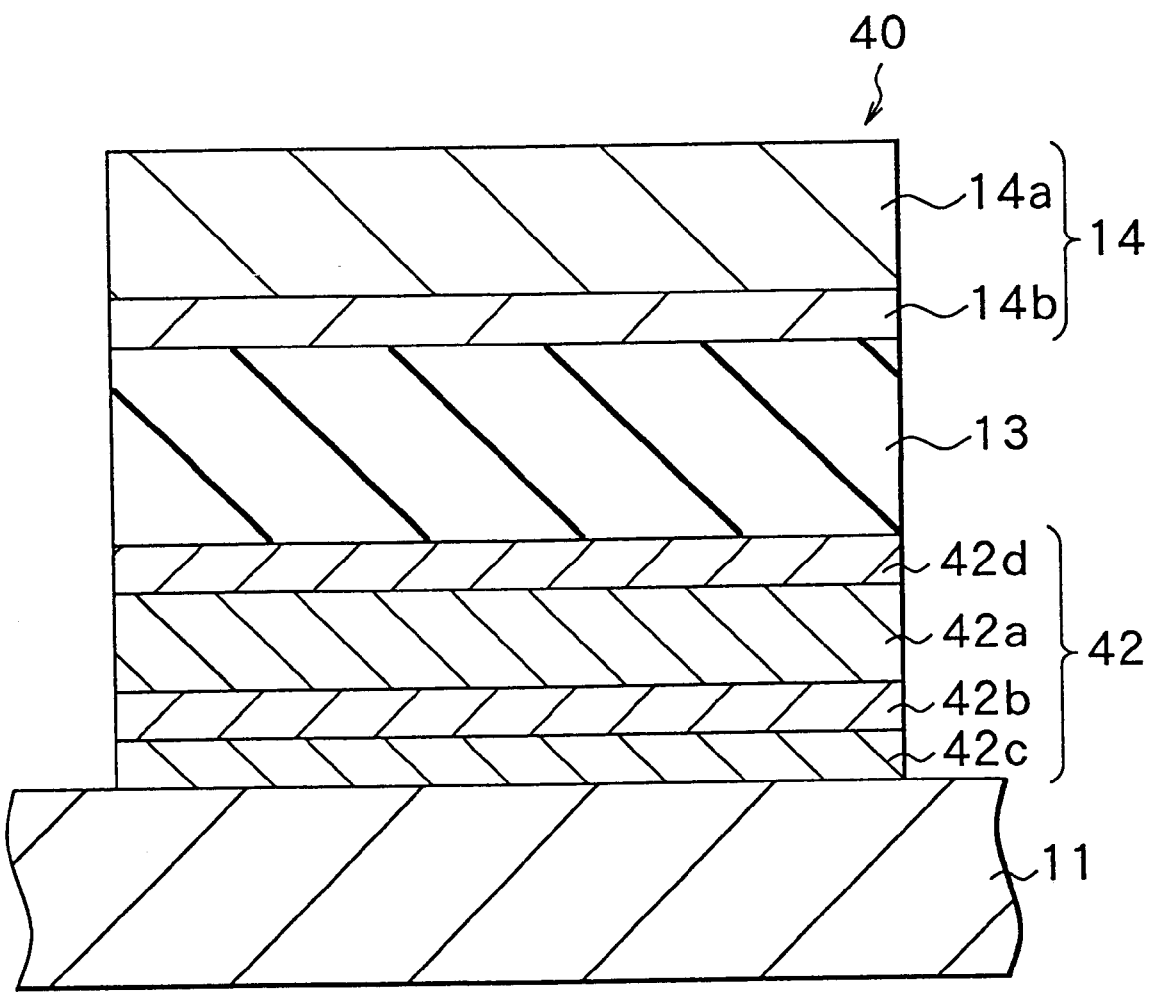
FIG. 5 is a cross section showing a construction of a dielectric capacitor according to a second embodiment of the present invention.

FIG. 5 shows the construction of a dielectric capacitor 40 according to this embodiment. The dielectric capacitor 40 includes the same construction as that of the first embodiment except that the structure of a bottom electrode 42 is different. Therefore, the same reference numbers are given to the same components, and the detailed description is omitted, here.

The bottom electrode 42 includes an oxygen inclusion layer 42a, a precious metal layer 42b and an adhesive layer 42c, for example. The oxygen inclusion layer 42a is a first electrode oxygen inclusion layer with a thickness of about 100 nm provided between the substrate portion 11 and the dielectric film 13. The precious metal layer 42b is a first electrode precious metal layer, which is approximately 20 nm in thickness and is provided between the oxygen inclusion layer 42a and the substrate portion 11. The adhesive layer 42c is approximately 20 nm in thickness and is provided between the precious metal layer 42b and the substrate portion 11. The bottom electrode 42 also includes a precious metal layer 42d, which is another first electrode precious metal layer with a thickness of about 20 nm provided between the oxygen inclusion layer 42a and the dielectric film 13, for example.

The oxygen inclusion layer 42a includes a function for preventing an element from diffusing between the substrate portion 11 or the dielectric film 13 and itself. The oxygen inclusion layer 42a mainly includes an oxygen inclusion material consisting of, for example, at least one selected from the precious metal element group shown in Table 1, at least one selected from the transition metal element group shown in Table 1, and oxygen. The following Chemical Formula 3 shows the composition formula of the oxygen inclusion material where an element in the precious metal element group is $M_{III}$ and an element in the transition metal element group is $M_{IV}$. Its composition range is preferably $90 \geq d \geq 4$, $15 \geq e \geq 2$, $f \geq 4$, $d+e+f=100$ in atom % similar to that of the oxygen inclusion layer 14a of the top electrode 14. The composition may be the same as or different from that of the oxygen inclusion layer 14a.

$$M_{IIId}M_{IVe}O_f \qquad \text{Chemical Formula 3}$$

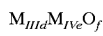

$M_{III}$: an element in the precious metal element group $M_{IV}$: an element in the transition metal element group The precious metal layer 42b is provided with a function for preventing deterioration of the adhesive layer 42c, thereby maintaining adhesion. The precious metal layer 42b includes mainly at least one selected from the precious metal group shown in Table 1, for example. While the precious metal layer 42b may include a precious metal element, which is different from that of the oxygen inclusion layer 42a, in the precious metal element group, preferably the precious metal layer 42b is composed so as to include the same precious metal element as that in the oxygen inclusion layer 42a. Therefore, the manufacturing device can be simplified, thereby improving productivity.

While the adhesive layer 42c may, for example, mainly include at least one selected from a group of elements comprising the adhesive layer described in the first embodiment, the adhesive layer 42c may be composed so as to include mainly alloy consisting of at least one selected from the precious metal element group shown in Table 1 and at least one selected from the transition metal element group shown in Table 1. If the adhesive layer 42c is composed so as to include mainly such alloy, the adhesive layer 42c can achieve commonality of elements with other layers in the bottom electrode 42, which can improve productivity.

The following Chemical Formula 4 shows the composition formula of the alloy where an element in the precious metal element group is $M_V$ and an element in the transition metal element group is $M_{VI}$. Its composition range is preferably $97 \geq g \geq 90$, $10 \geq h \geq 3$, $g+h=100$ in atom %. If the precious metal element Mv exceeds this range, the sufficient adhesion cannot be obtained. More transition metal element $M_{VI}$ causes deterioration of the surface characteristic and lowers adhesion due to selective oxidation of the transition metal element $M_{VI}$.

$$M_{Vg}M_{VIh} \qquad \text{Chemical Formula 4}$$

$M_V$: an element in the precious metal element group $M_{VI}$: an element in the transition metal element group A more preferable composition range of the alloy is $95 \geq d \geq 91$, $9 \geq e \geq 5$, $d+e=100$ in atom %. Within this range, better surface characteristics and adhesion can be obtained. In addition, this alloy is crystalline. This alloy may include the precious metal element $M_V$, which is different from that of the oxygen inclusion layer 42a or the precious metal layer 42b, and also may include the transition metal element $M_{VI}$, which is different from that of the oxygen inclusion layer 42a. However, preferably the alloy is composed so as to include the same element as that in the oxygen inclusion layer 42a or the precious metal layer 42b in view of productivity, as described above.

The precious metal layer 42d mainly includes at least one selected from the precious metal element group shown in Table 1, for example. The element in the precious metal layer 42d is more susceptible to the diffusion than that in the oxygen inclusion layer 42a. Thus, the precious metal layer 42d includes an aid function for supporting the better crystal growth when the dielectric film 13 is formed. Inclusion of the precious metal layer 42d is not necessary, but preferable so that better crystal condition can be provided in the dielectric film 13, which improves the characteristics. Incidentally, while the precious metal layer 42d may include a precious metal element different from that in the oxygen inclusion layer 42a, the precious metal layer 42b and the adhesive layer 42c from the precious metal element group, preferably the precious metal layer 42d is composed so as to include the same precious metal element as that in the oxygen inclusion layer 42a, the precious metal layer 42b and the adhesive layer 42c layers in view of productivity.

Figure 6:
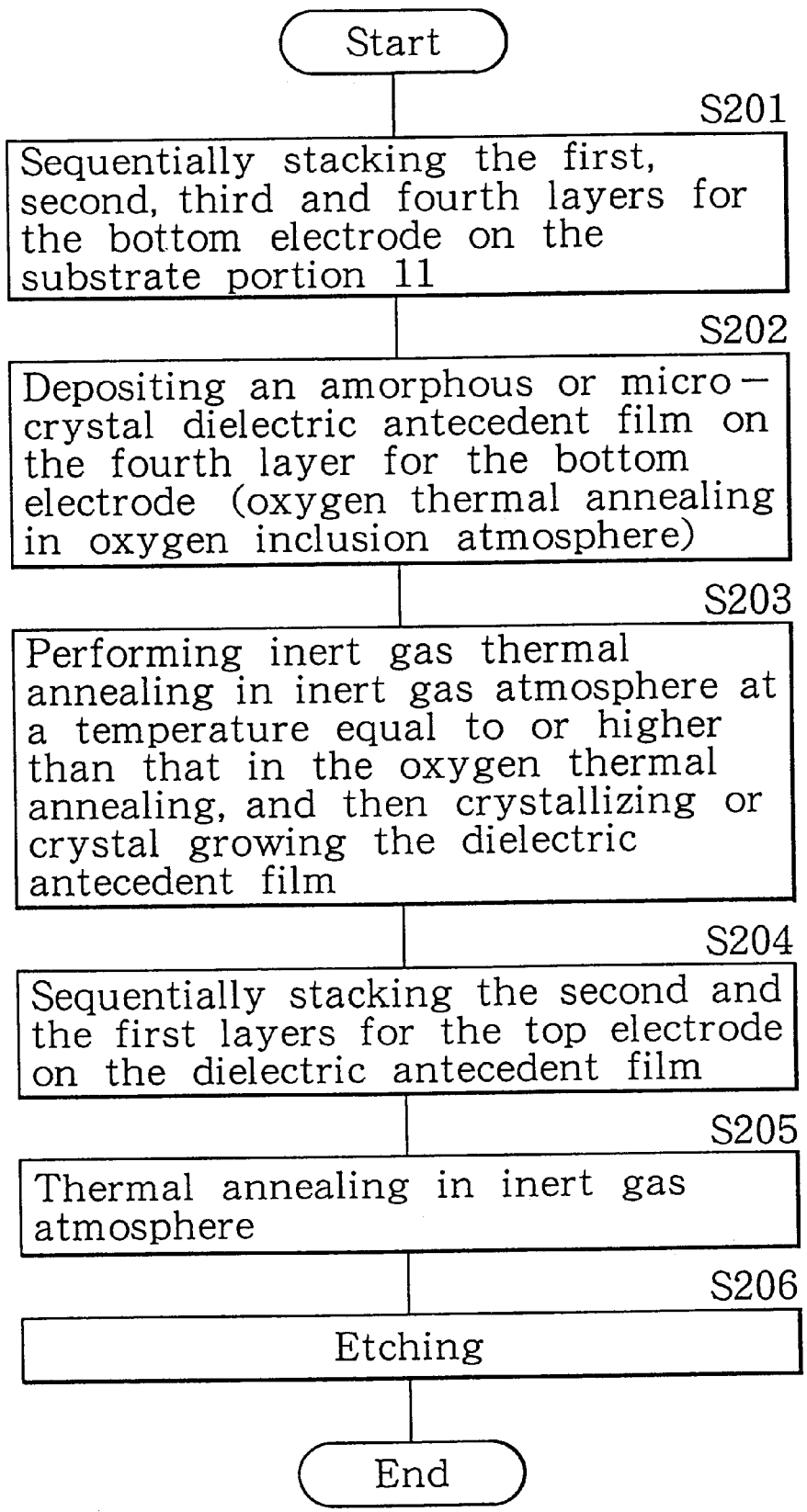
FIG. 6 is a flow chart showing steps of the manufacturing method of the dielectric capacitor shown in FIG. 5.

The dielectric capacitor 40 having the construction described above can be manufactured as follows:

FIG. 6 shows steps of the manufacturing process of the dielectric capacitor 40. First of all, as a step for forming a first electrode, a first layer for the bottom electrode is deposited approximately 20 nm in thickness by using the alloy $M_{Vg}M_{VIh}$ described above on the substrate portion 11 by the sputtering method, for example. A second layer for the bottom electrode is formed approximately 20 nm in thickness by using at least one selected from the precious metal element group described above on the first layer. A third layer including oxygen for the bottom electrode is deposited approximately 100 nm in thickness by using the oxygen inclusion material $M_{IIId}M_{IVe}O_f$ described above on the second layer. A fourth layer for the bottom electrode is formed approximately 20 nm in thickness by using at least one selected from the precious metal element group described above on the third layer (Step S201). The first layer for the bottom electrode is to construct the adhesive layer 42c, and the second layer for the bottom electrode is to construct the precious metal layer 42b. The third layer for the bottom electrode is to construct the oxygen inclusion layer 42a, and the fourth layer for the bottom electrode is to construct the precious metal layer 42d.

Next, as a step for forming the dielectric film 13, in the same manner as the first embodiment, an amorphous or microlite dielectric antecedent film is coated on the fourth layer (Step S202). That is, a sol-gel solution is deposited on the fourth layer and, then, the rapid thermal annealing is performed in an oxygen inclusion atmosphere. The first, second, third and fourth layers for the bottom electrode are partially oxidized by oxygen thermal annealing.

Then, also as a step for forming the dielectric film 13, the thermal annealing is performed in an inert gas atmosphere to crystallize or crystal grow the dielectric antecedent film (Step S203). As a result, the characteristic deterioration of the dielectric film 13 is prevented even if hydrogen annealing is performed after this step. This is considered to be because the oxide generated in a part of the first, second, third, and fourth layers for the bottom electrode by oxygen thermal annealing in Step S202 is reduced by the inert gas thermal annealing but not reduced by the hydrogen annealing. In order to sufficiently prevent the characteristic deterioration of the dielectric film 13, the inert gas thermal annealing is preferably performed at a temperature higher than that in the oxygen thermal annealing at Step S202. Since the second layer is formed by using at least one selected from the precious metal element group described above between the first layer and the third layer, deterioration of the first layer is prevented and its adhesion is maintained even if the inert gas thermal annealing is performed.

After the inert gas thermal annealing, in the same manner as the first embodiment, for example, the second and the first layers for the top electrode are sequentially deposited and stacked on the dielectric antecedent film (Step S204), and the thermal annealing is performed thereon in an inert gas atmosphere (Step S205). Then, in the same manner as the first embodiment, the first and the second layers for the top electrode, the dielectric antecedent film, and the fourth, third, second, and first layers for the bottom electrode are processed into a predetermined shape by etching (Step S206), respectively. Since the oxygen inclusion material $M_{IIId}M_{IVe}O_f$ is used to form the third layer for the bottom electrode in addition to the first layer for the top electrode, here, the microfabrication is much easier. As a result, the dielectric capacitor 40 shown in FIG. 5 is formed.

The dielectric capacitor 10 may be manufactured by the following processes.

Figure 7:
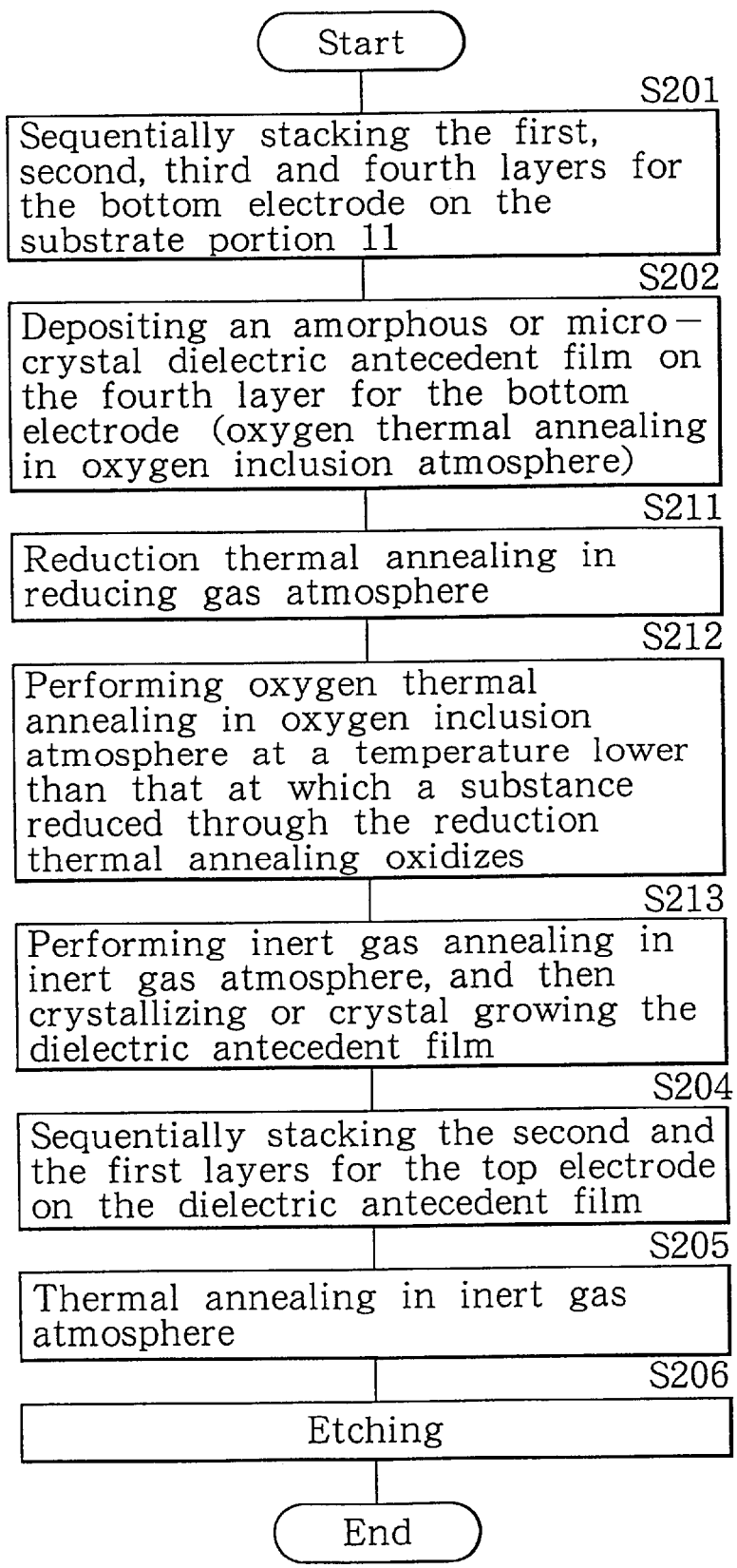
FIG. 7 is a flow chart showing steps of another manufacturing method of the dielectric capacitor shown in FIG. 5.

FIG. 7 shows steps of another manufacturing process of the dielectric capacitor 40. First of all, in the same manner as the manufacturing method described above, the first layer, second layer, third layer and fourth layer for the bottom electrode are sequentially deposited and stacked on the substrate portion 11 (Step S201), for example. Next, as a step for forming the dielectric film 13, in the same manner as the earlier manufacturing method, the dielectric antecedent film is deposited on the fourth layer (Step S202). The oxygen thermal annealing here oxidizes the first, second, third and fourth layers for the bottom electrode partially.

Next, also as a step for forming the dielectric film 13, reduction thermal annealing is performed thereon in a reductive gas atmosphere including hydrogen gas ($H_2$), carbon monoxide gas (CO) or methane gas($CH_4$), for example (Step S211). The oxide generated in a part of the first, second, third, and fourth layers for the bottom electrode is reduced by the oxygen thermal annealing in Step S202. As a result, the characteristic deterioration of the dielectric film 13 is prevented even if the hydrogen annealing is performed after this step. Since this reduction thermal annealing can be performed at a lower temperature than inert gas thermal annealing (Step S203) in the manufacturing method described above, the more stable characteristic can be obtained than that in the earlier manufacturing method, which improves productivity.

After the reduction thermal annealing, also as a step for forming the dielectric film 13, another oxygen thermal annealing is performed, as necessary, in an oxygen inclusion atmosphere at a lower temperature than the temperature at which the substance reduced in the reduction thermal annealing oxidizes (Step S212). As a result, oxygen is added to the dielectric antecedent film and therefore the characteristic of the dielectric film 13 is improved. Incidentally, the oxygen thermal annealing is not necessary.

After oxygen thermal annealing takes place as necessary, also as a step for forming the dielectric film 13, thermal annealing is performed in an inert gas atmosphere, for example, to crystallize or crystal grow the dielectric antecedent film (Step S213). For preventing a part of the first, second, third and fourth layers for the bottom electrode from being re-oxidized in this step, the thermal annealing is performed not in an oxygen inclusion atmosphere, but in an inert gas atmosphere. The temperature for the inert gas thermal annealing is different from that used in the manufacturing method described above, and the thermal annealing need not to be performed at a temperature equal to or higher than the temperature used in the oxygen thermal annealing in Step S202. This is because oxide generated in a part of the first, second, third and fourth layers for the bottom electrode has been reduced already by the reduction thermal annealing in Step S213.

Again, the second layer is formed by at least one selected from the precious metal element group described above between the first layer and the third layer for the bottom electrode. Consequently, the first layer is prevented from being deteriorated and thus adhesion is maintained even if the reduction thermal annealing and the inert gas thermal annealing are performed.

After the inert gas thermal annealing is performed, in the same manner as the earlier manufacturing method described above, the second and the first layers for the top electrode is sequentially deposited and stacked on the dielectric antecedent film (Step S204), and the thermal annealing is performed thereon in an inert gas atmosphere (Step S205). Then, in the same manner as the earlier manufacturing method, the first and the second layers for the top electrode, the dielectric antecedent film, and the fourth, third, second, and first layers for the bottom electrode are processed into a predetermined form by etching, respectively (Step S206). Thus, the dielectric capacitor 40 shown in FIG. 5 is formed.

Also in this embodiment, in the same manner as the first embodiment, the second and the first layers for the top electrode may be deposited and, then, processed by etching before the dielectric antecedent film is crystallized or crystal grown.

Figure 8:
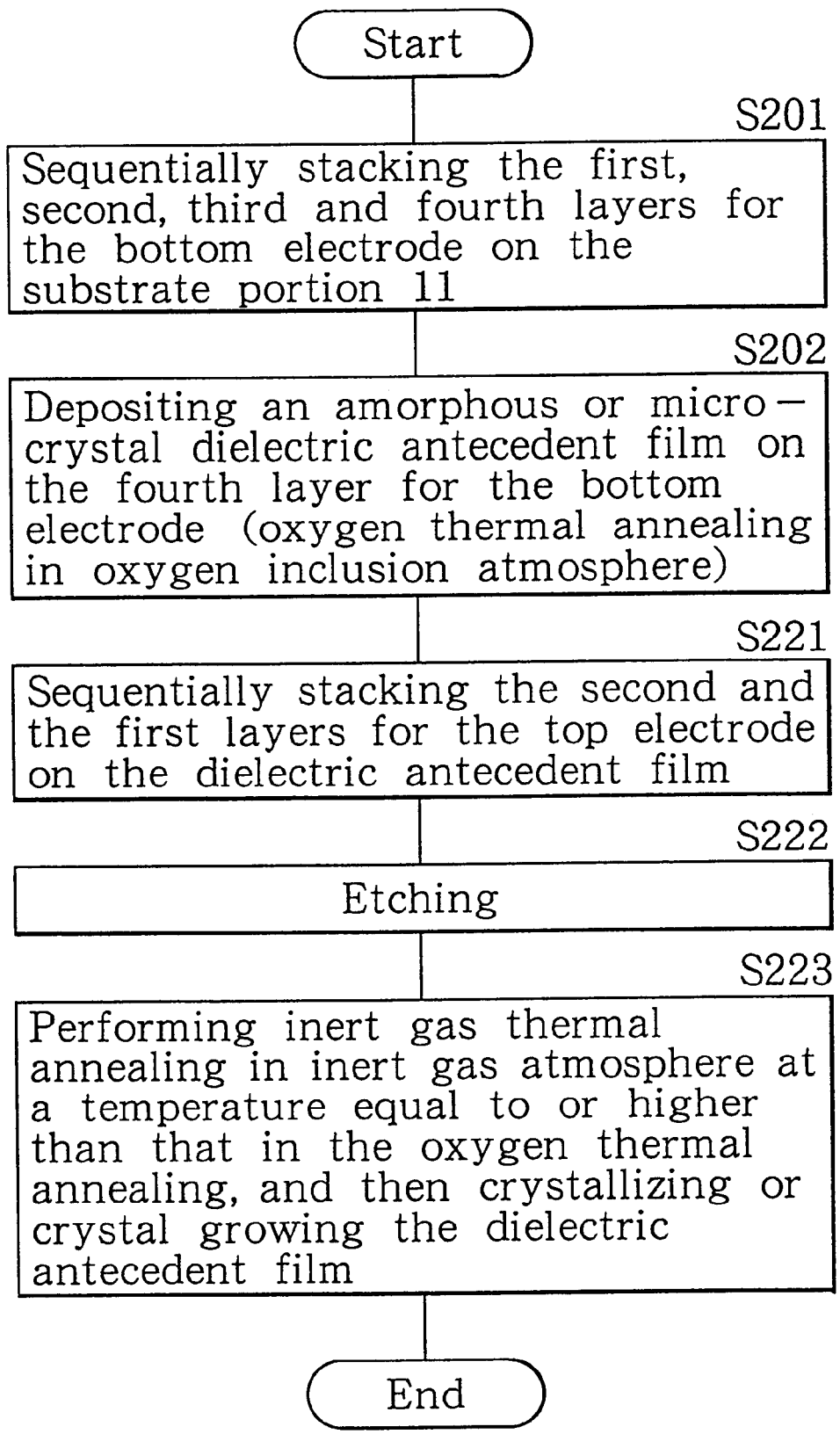
FIG. 8 is a flow chart showing steps of still another manufacturing method of the dielectric capacitor shown in FIG. 5

FIG. 8 shows steps of the manufacturing process. That is, first of all, in the same manner as the earlier manufacturing method, the first, second, third and fourth layers for the bottom electrode are sequentially stacked on the substrate portion 11 (Step S201), and an amorphous or microlite dielectric antecedent film is deposited thereon (Step S202). Next, in the same manner as the earlier manufacturing method, for example, the second and the first layers for the top electrode are sequentially stacked and deposited on the dielectric antecedent film (Step S221). The first and the second layers for the top electrode, the dielectric antecedent film and the fourth, third, second, and first layers for the bottom electrode are molded by etching into a predetermined form, respectively (Step S222). Then, inert gas thermal annealing is performed in an inert gas atmosphere at the temperature equal to or higher than the temperature in the oxygen thermal annealing, for example, to crystallize or crystal grow the dielectric antecedent film (Step S223). Thus, the dielectric capacitor 40 shown in FIG. 5 is formed.

Figure 9:
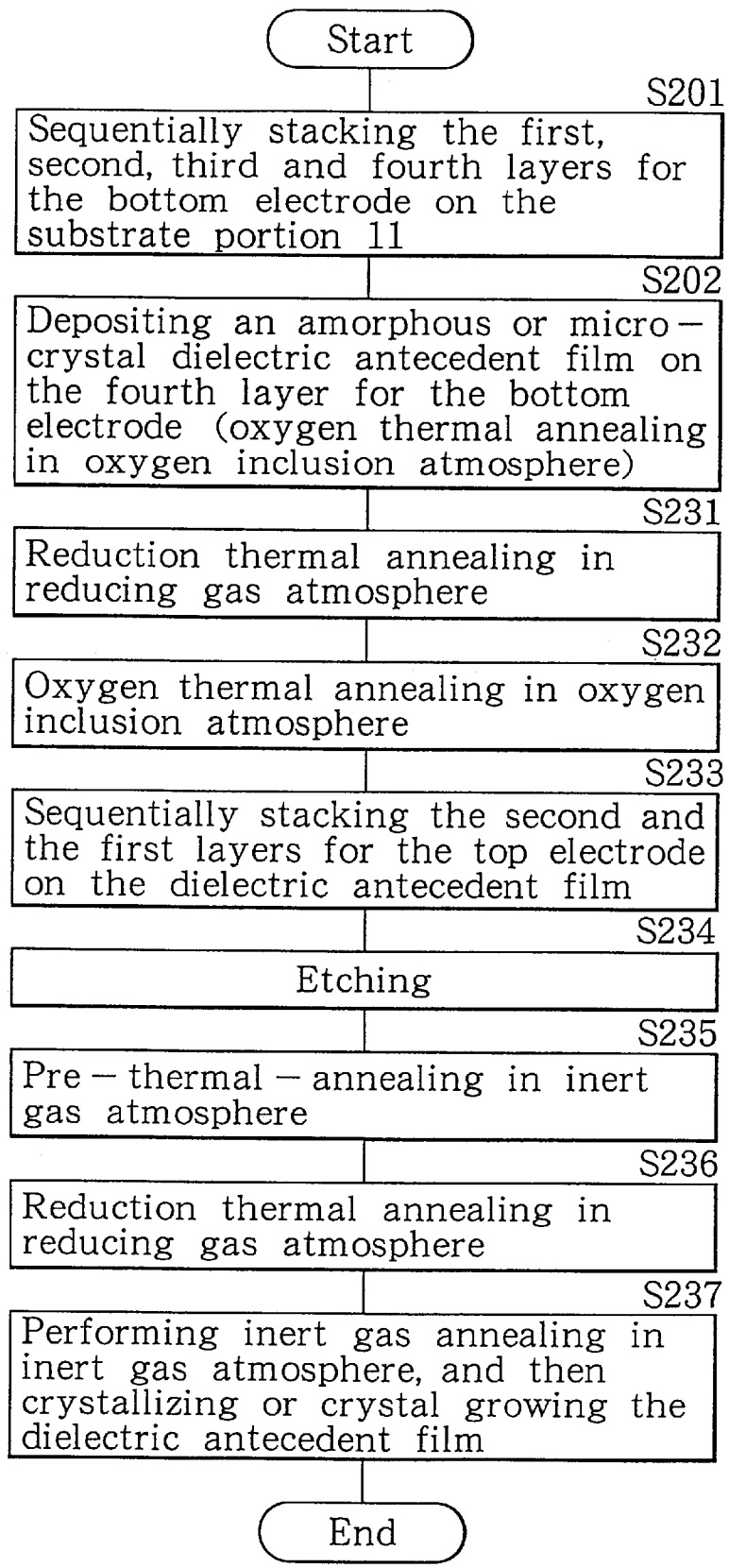
FIG. 9 is a flow chart showing yet another manufacturing method of the dielectric capacitor shown in FIG. 5.

Further, FIG. 9 shows another manufacturing process. That is, first of all, in the same manner as the earlier manufacturing method, the first, second, third and fourth layers for the bottom electrode are sequentially stacked on the substrate portion 11 (Step S201), and the amorphous or microlite dielectric antecedent film is deposited thereon (Step S202). Then, for example, the reduction thermal annealing is performed in a reducing gas atmosphere as necessary (Step S231). When the dielectric antecedent film is divided into a plurality of layers and, then, deposited, the reduction thermal annealing may be performed for each time when one layer is deposited. This is especially useful for the case the amorphous dielectric antecedent film is deposited.

Next, oxygen thermal annealing is performed as necessary in an oxygen inclusion atmosphere to add oxygen to the dielectric antecedent film (Step S232). Then, for example, in the same manner as the manufacturing method described above, the second and the first layers for the top electrode are sequentially deposited and stacked on the dielectric antecedent film (Step S233), and the first and the second layers for the top electrode, the dielectric antecedent film, and the fourth, third, second, and first layers for the bottom electrode are processed into a predetermined form by etching, respectively (Step S234). After that, pre-thermal-annealing is performed in an inert gas atmosphere, for example, to slightly crystallize or crystal grow the dielectric antecedent film (Step S235). This is because it is more preferable that subsequent reduction thermal annealing is performed in a condition where the crystallization of the dielectric antecedent film is advanced to a certain extent. After the pre-thermal-annealing has been performed, in the same manner as the manufacturing method described above, for example, the reduction thermal annealing is performed (Step 236). Then, the inert gas thermal annealing is performed to crystallize or crystal grow the dielectric antecedent film (Step 237). Thus, the dielectric capacitor 40 shown in FIG. 5 is formed.

This dielectric capacitor 40 operates in the same manner as the first embodiment, and is used for a memory in the same manner as the first embodiment.

According to this embodiment, since the top electrode 14 is formed of the oxygen inclusion material $M_{Ia}M_{IIb}O_c$, favorable characteristics can be obtained in addition to the effect described in the first embodiment described above even when the second and the first layers for the top electrode are deposited, respectively, and, then, the thermal annealing is performed thereon in an inert gas atmosphere. Therefore, after the dielectric antecedent film is deposited, the inert gas thermal annealing or the reduction thermal annealing is performed, thereby preventing the characteristics from being deteriorated due to hydrogen annealing which is performed in order to recover a function of a transistor.

Further, since the bottom electrode 42 is formed of the oxygen inclusion material $M_{IIId}M_{IVe}O_f$, diffusion of elements can be prevented between the substrate portion 11 and itself, and the dielectric film 13 and itself, which can improve the characteristics and also simplify microfabrication of the bottom electrode 42. Furthermore, since the precious metal layer 42b is provided between the oxygen inclusion layer 42a and the adhesive layer 42c, adhesion of the bottom electrode 42 can be maintained even if the inert gas annealing or reduction gas annealing is performed in order to prevent deterioration of characteristics due to the hydrogen annealing. In addition, when adhesive layer 42c includes the alloy $M_{Vg}M_{VIh}$, the oxygen inclusion layer 42a and the precious metal layers 42b and 42d can maintain commonality of elements with the adhesive layer 42c, which enhances the productivity. Still further, when the precious metal layer 42d is provided between the oxygen inclusion layer 42a and the dielectric film 13, the characteristics of the dielectric material 13 can be enhanced.

EXAMPLES

Further, specific examples according to the present invention will be described in detail with reference to FIGS. 1 through 9.

Example 1

First of all, a silicon dioxide film of 30 nm in thickness formed on a silicon base was used for the substrate portion 11a. A first layer for the bottom electrode of 20 nm in thickness made of titanium and a second layer for the bottom electrode of 200 nm in thickness made of platinum were sequentially deposited and stacked by sputtering (see Step S101, FIG. 2).

Next, a sol-gel solution containing strontium, bismuth and tantalum in the mole ratio of Sr:Bi:Ta=0.8:2.2:2.0 was prepared, and the sol-gel solution was applied on the second layer for the bottom electrode by the spin coat method. Then, thermal annealing took place at a temperature of 250° C. in the atmosphere for seven minutes to remove an organic solvent component, and RTA was performed under the following condition.

[RTA Condition]

Atmosphere gas: mixed gas of nitrogen gas and oxygen gas; nitrogen gas-oxygen gas ratio (volume ratio): $N_2:O_2=4:1$ Speed of temperature increase: 760° C./10 sec.

Maximum temperature achieved: 760° C.

Maximum temperature retaining time: 30 sec.

By the RTA, a layer structure oxide (called SBT in the following) including strontium, bismuth and tantalum was obtained. The SBT was microlite. Then, the process from applying the so-gel solution to RTA was repeated three times, and a dielectric antecedent film of 170 nm in thickness mainly including SBT was deposited (see Step S102, FIG. 2).

Then, oxygen thermal annealing was performed at a temperature of 750° C. in an oxygen atmosphere for one hour (see Step S103, FIG. 2). After the oxygen thermal annealing, a first layer of 200 nm in thickness for the top electrode was deposited on the dielectric antecedent film using $Ir_aHf_bO_c$ by the sputtering method (see Step S104, FIG. 2), and the thermal annealing was performed at a temperature of 750° C. in a nitrogen atmosphere for 30 minutes (see Step S105, FIG. 2). Thereafter thus stacked layers were processed by etching (see Step S106, FIG. 2), thereby finishing the dielectric capacitor 10.

Ferroelectric characteristics of this dielectric capacitor 10 were measured. The manufacturing condition and the measurement results for the dielectric capacitor 10 are shown in Table 2 and 3. As shown in Table 2 and 3, the dielectric polarization value 2 Pr was 19 $\mu C/cm^2$ and the coercive voltage 2 Vc was 1.8 V, which were favorable values as a dielectric capacitor including SBT. That is, it is found that if the top electrode is formed with $Ir_aHf_bO_c$, favorable characteristics can be obtained even when thermal annealing was performed in an inert gas atmosphere after deposition.

TABLE 2

| | Composition of Top Electrode 14 | Composition of Bottom Electrode 12 | Composition of Dielectric Film 13 | Annealing in forming Dielectric Film 13 | Timing of Depositing Top Electrode 14 | Composition of Substrate Portion 11 |
|---|---|---|---|---|---|---|
| EX. 1 | $Ir_aHf_bO_c$ | Pt/Ti | SBT | 750° C., $O_2$ Atmosphere | After Crystal Grown | $SiO_2$ Film (30 nm thick) |
| EX. 2 | $Ir_aHf_bO_c/Ir$ | Pt/Ti | SBT | 750° C., $O_2$ Atmosphere | After Crystal Grown | $SiO_2$ Film (30 nm thick) |
| EX. 3 | $Ir_aHf_bO_c/Ir$ | $Ir/Ir_dHf_eO_f/Ir/Ir_{92}Hf_8$ | SBTN | 1.400° C. Reduction Atmosphere 2.750° C. $N_2$ Atmosphere | After Crystal Grown | Si Base $SiO_2$ Film (300 nm thick) |
| EX. 4 | $Ir_aHf_bO_c$ | $Ir/Ir_dHf_eO_f/Ir/Ti$ | SBTN | 1.750° C. $N_2$ Atmosphere 2.400° C. Reduction Atmosphere 3.750° C. $N_2$ Atmosphere | Before Crystal Grown | Si Base $SiO_2$ Film (300 nm thick) |
| EX. 5 | $Ir_aHf_bO_c/Ir$ | $Ir/Ir_dHf_eO_f/Ir/Ti$ | SBTN | 1.750° C. $N_2$ Atmosphere 2.400° C. Reduction Atmosphere 3.750° C. $N_2$ Atmosphere | Before Crystal Grown | Si Base $SiO_2$ Film (300 nm thick) |
| EX. 6 | $Ir_aHf_bO_c/Ir$ | $Ir/Ir_dHf_eO_f/Ir/Ir_{92}Hf_8$ | SBT | 1.400° C. Reduction Atmosphere 2.450° C. $O_2$ Atmosphere 3.750° C. $N_2$ Atmosphere 4.400° C. Reduction Atmosphere 5.750° C. $N_2$ Atmosphere | Before Crystallization | Si Base |

TABLE 3

| | Characteristics | | | |
|---|---|---|---|---|
| | Before Hydrogen Annealing | | After Hydrogen Annealing | |
| | Dielectric Polarization 2Pr ($\mu C/cm^2$) | Resistance Volt. 2Vc (V) | Dielectric Polarization 2Pr($\mu C/cm^2$) | Resistance Volt. 2Vc (V) |
| EX. 1 | 19 | 1.8 | — | — |
| EX. 2 | 19 | 1.8 | — | — |
| EX. 3 | 18 | 2.0 | 18 | 2.0 |
| | 18 | 2.0 | 18 | 2.0 |
| EX. 4 | 17 | 2.0 | 16 | 2.0 |
| | 17 | 2.0 | 16 | 2.0 |
| EX. 5 | 18 | 2.0 | 18 | 2.0 |
| | 18 | 2.0 | 18 | 2.0 |
| EX. 6 | 18 | 2.0 | 18 | 2.0 |

Example 2

The dielectric capacitor 10 was manufactured in the same condition as that in the first example, except that, before depositing the first layer for the top electrode, a second layer of 20 nm in thickness for the top electrode was deposited using iridium by the sputtering method on the dielectric antecedent film, and a first layer for the top electrode was deposited on the second layer (see Step 104, FIG. 2). Again, the ferroelectric characteristics were examined in regard to this dielectric capacitor 10 in the same manner as the first example. The manufacturing condition and the measurement results for the dielectric capacitor 10 are shown in Table 2 and 3. Table 2 and 3 provides 19 $\mu C/cm^2$ for the dielectric polarization value 2 Pr and 1.8 V for the coercive voltage 2 Vc, which were favorable values as a dielectric capacitor. Compared to the first example, less variation of the characteristics was found in this example. That is, it is found that providing the precious metal layer 14b between the oxygen inclusion layer 15a and the dielectric film 13 in the top electrode 14 improves the variation of characteristics.

Example 3

First of all, two kinds of the substrate portion 11, one comprising a silicon base and the other comprising a silicon dioxide film of 300 nm in thickness formed on the silicon base were prepared. Then, by the sputtering method, a first layer for the bottom electrode of 20 nm in thickness with $Ir_{92}Hf_8$ (atom %), a second layer for the bottom electrode of 20 nm in thickness with iridium, a third layer for the bottom electrode of 100 nm in thickness with $Ir_dHf_eO_f$, and a fourth layer for the bottom electrode of 20 nm in thickness with iridium were sequentially deposited and stacked on the silicon base and the silicon dioxide film (see Step S201, FIG. 7).

Next, a sol-gel solution including strontium, bismuth, tantalum and niobium in the mole ratio of Sr:Bi:Ta:Nb=

0.8:2.2:1.75:0.25 was prepared, and a dielectric antecedent film of 170 nm in thickness mainly including layer structure oxide including strontium, bismuth, tantalum and niobium (Called SBTN in the following) was deposited, respectively, in the same manner as the first example (see Step S202, FIG. 7). RTA was performed under the following condition.
[RTA Condition]

Atmosphere gas: mixed gas of nitrogen gas and oxygen gas, nitrogen gas-oxygen gas ratio (volume ratio) $N_2:O_2=4:1$ Speed of temperature increase: 740° C./10 sec.

Maximum temperature achieved: 740° C.

Maximum temperature retaining time: 30 sec.

Then, the reduction thermal annealing was performed, respectively, under the following condition (see Step S211, FIG. 7).
[Reduction Thermal Annealing Condition]

Atmosphere gas: mixed gas of nitrogen gas and oxygen gas; nitrogen gas-oxygen gas ratio (volume ratio) $N_2:O_2=96:4$ Annealing temperature: 400° C.

Annealing time: 1 hr.

After the reduction thermal annealing was performed, the inert gas thermal annealing was performed at a temperature of 750° C. in a nitrogen atmosphere for one hour, respectively (see Step S213, FIG. 7). After the inert gas thermal annealing, a second layer for the top electrode made of iridium with a thickness of 20 nm and a first layer for the top electrode made of $Ir_aHf_bO_c$ with a thickness of 200 nm were sequentially deposited and stacked by the sputtering method, respectively (see Step S204, FIG. 7). Then, the thermal annealing was performed in a nitrogen atmosphere in the same manner as the first example (see Step S205, FIG. 7) and thus stacked layers were processed by etching, respectively (see Step S206, FIG. 7). As a result, the respective dielectric capacitors 40 were obtained.

The ferroelectric characteristics were examined in regard to these dielectric capacitors 40, respectively in the same manner as the first example. The manufacturing condition and the measurement results of these dielectric capacitors 40 are shown in Table 2 and 3. In both cases where the substrate portion 11 was a silicon base and the case where the substrate portion 11 was a silicon dioxide film, Table 2 and 3 provides 18 $\mu C/cm^2$ for the dielectric polarization value 2 Pr and 2.0 V for the coercive voltage 2 Vc, which were favorable values as a dielectric capacitor with SBTN.

Further, hydrogen annealing was performed and then the recovery thermal annealing was performed on these dielectric capacitors 40 at a temperature of 450° C. in a nitrogen atmosphere for 30 minutes under the following condition.
[Hydrogen Annealing Condition]

Atmosphere gas: mixed gas of nitrogen gas and oxygen gas, nitrogen gas-oxygen gas ratio (volume ratio) $N_2:O_2=96:4$ Annealing temperature: 400° C.

Annealing time: 1 hr.

After that, the ferroelectric characteristics were examined in regard to the dielectric capacitors 40 on which the hydrogen annealing was performed. The results are also shown in Table 2 and 3, respectively. In both cases where the substrate portion 11 was a silicon base and the case where the substrate portion 11 was a silicon dioxide film, Table 2 and 3 provides 18 $\mu C/cm^2$ for the dielectric polarization value 2 Pr and 2.0 V for the coercive voltage 2 Vc, which were the same values as before the hydrogen annealing.

Thus, it is found the characteristics were not deteriorated even though hydrogen annealing was performed. That is, it is further found that if the top electrode was formed of $Ir_aHf_bO_c$, the dielectric capacitor can be obtained, whose characteristics are not deteriorated even when hydrogen annealing is performed for recovering the functions of the transistor.

Example 4

First of all, two kinds of the substrate portion 11, one comprising a silicon base and the other comprising a silicon dioxide film of 300 nm in thickness formed on the silicon base were prepared. Then, on each of the substrate portions 11, a first layer for the bottom electrode made of titanium with a thickness of 20 nm, a second layer for the bottom electrode made of iridium with a thickness of 20 nm, a third layer for the bottom electrode made of $Ir_dHf_eO_f$ with a thickness of 100 nm, and a fourth layer for the bottom electrode made of iridium with a thickness of 20 nm were sequentially deposited and stacked by the sputtering method (see Step S201, FIG. 9).

Next, a sol-gel solution containing strontium, bismuth, tantalum and niobium in the mole ratio of Sr:Bi:Ta:Nb= 0.8:2.2:1.75:0.25 was prepared, and a dielectric antecedent film mainly including SBTN was deposited, respectively, in the same manner as the first example (see Step S202, FIG. 9). RTA was performed under the following condition.
[RTA Condition]

Atmosphere gas: mixed gas of nitrogen gas and oxygen gas; nitrogen gas-oxygen gas ratio (volume ratio): $N_2:O_2=4:1$ Speed of temperature increase: 740° C./10 sec.

Maximum temperature achieved: 740° C.

Maximum temperature retaining time: 30 sec.

Here, the surface condition of the dielectric antecedent film was observed using a scanning electron microscope (SEM). Collection of grains of approximately 20 nm in grain size was observed, which indicated the favorable surface characteristic. Further, when the identification analysis was performed thereon by X-ray diffraction, existence of iridium oxide ($IrO_2$) was recognized. That is, a part of second, third and fourth layers for the bottom electrode was oxidized through the oxygen thermal annealing.

Next, a first layer for the top electrode of 200 nm in thickness, was deposited with $Ir_aHf_bO_c$ on the dielectric antecedent film by the sputtering method, respectively (see Step S233, FIG. 9). After that, the pre-thermal annealing was performed thereon at a temperature of 750° C. in a nitrogen atmosphere for 30 minutes, respectively (see Step S235, FIG. 9). Then, the reduction thermal annealing was performed thereon under the following condition, respectively (see Step S236, FIG. 9). Here, when the identification analysis was performed through the X-ray diffraction again, existence of iridium oxide was not recognized. That is, the oxide generated in part of the second, third, and fourth layers for the bottom electrode through the oxygen thermal annealing was reduced through the reduction thermal annealing.
[Reduction Thermal Annealing Condition]

Atmosphere gas: mixed gas of nitrogen gas and hydrogen gas; nitrogen gas-hydrogen gas ratio (volume ratio): $N_2:H_2=96:4$ Annealing temperature: 400° C.

Annealing time: 1 hr.

After the reduction thermal annealing was performed, the inert gas thermal annealing was performed at a temperature of 750° C. in a nitrogen atmosphere for one hour (see Step S237, FIG. 9). Here, again, when the surface was observed through the SEM, it was observed that the size of the grain of the dielectric antecedent film had grown up to approximately 100 nm. Then, films such as the dielectric antecedent film were processed by etching and thereby the dielectric capacitors 40 were obtained.

After that, the ferroelectric characteristics were examined in regard to the dielectric capacitors 40 in the same manner as the first example, respectively. In the same manner as the third example, the ferroelectric characteristics were measured after the hydrogen annealing. The manufacturing condition of the dielectric capacitors 40 and the measurement results are shown in Table 2 and 3, respectively. In both cases where the substrate portion 11 was a silicon base and the case where the substrate portion 11 was a silicon dioxide film, Table 2 and 3 provides favorable values of 17 $\mu C/cm^2$ for the dielectric polarization value 2 Pr and 2.0 V for the coercive voltage 2 Vc before the hydrogen annealing, and 16 $\mu C/cm^2$ for the dielectric polarization value 2 Pr and 2.0 V for the coercive voltage 2 Vc after the hydrogen annealing. Almost no deterioration was found through the hydrogen annealing. It is recognized that deterioration was reduced by repeating the hydrogen annealing and the recovery thermal annealing several times.

As a comparative example (Comparative Example 1) for the fourth example, a dielectric capacitor was manufactured under the same condition as that of the fourth example except that the top electrode was formed of iridium. Measurement of the ferroelectric characteristics was performed in the same manner in regard to this dielectric capacitor. The manufacturing condition of the dielectric capacitor and the measurement results are shown in Table 4 and 5. The dielectric capacitor shorted out completely after the hydrogen annealing, and the characteristics could not be measured.

TABLE 4

| | Manufacturing Condition | | | | | |
|---|---|---|---|---|---|---|
| | Composition of Top Electrode 14 | Composition of Bottom Electrode 12 | Composition of Dielectric Film 13 | Annealing in forming Dielectric Film 13 | Timing of Depositing Top Electrode 14 | Composition of Substrate Portion 11 |
| Comparative Example 1 | Ir | Ir/Ir$_d$Hf$_e$O$_f$/Ir/Ti | SBTN | 1.750° C. N$_2$ Atmosphere 2.400° C. Reduction Atmosphere 3.750° C. N$_2$ Atmosphere | Before Crystal Grown | Si Base SiO$_2$ film (300 nm thick) |
| Comparative Example 2 | Pt | Ir/Ir$_d$Hf$_e$O$_f$/Ir/Ir$_{g2}$Hf$_g$ | SBT | 1.400° C. Reduction Atmosphere 2.450° C. O$_2$ Atmosphere 3.750° C. N$_2$ Atmosphere 4.400° C. Reduction Atmosphere 5.750° C. N$_2$ Atmosphere | Before Crystallization | Si Base |

| | Characteristics | | | |
|---|---|---|---|---|
| | Before Hydrogen Annealing | | After Hydrogen Annealing | |
| | Dielectric Polarization 2Pr ($\mu C/cm^2$) | Resistance Volt. 2Vc (V) | Dielectric Polarization 2Pr ($\mu C/cm^2$) | Resistance Volt. 2Vc (V) |
| Comparative Example 1 | — | — | N/A | N/A |
| Comparative Example 2 | N/A | N/A | N/A | N/A |
|  |  |  | — | — |

As shown in Table 4 and 5, it is found that when the top electrode is formed of Ir$_a$Hf$_b$O$_c$, the favorable dielectric capacitor can be obtained even if the first layer for the top electrode is deposited before crystals of the dielectric antecedent film are grown.

Example 5

The dielectric capacitors 40 were manufactured under the same condition as that of the fourth example, respectively, except that, before a first layer for the top electrode is deposited, a second layer for the top electrode of 20 nm in thickness was deposited with iridium by the sputtering method on the dielectric antecedent film, and then the first layer for the top electrode was deposited on the second layer (see Step S233, FIG. 9). Similarly, the ferroelectric characteristics were examined in regard to these dielectric capacitors 40. The manufacturing condition of the dielectric capacitors 40 and their results are shown in Table 2 and 3. In both cases where the substrate portion 11 was a silicon base and the substrate portion 11 was a silicon dioxide film, Table 2 and 3 provides favorable values of 18 $\mu C/cm^2$ for the dielectric polarization value 2 Pr and 2.0 V for the coercive voltage 2 Vc before and after the hydrogen annealing, and no deterioration was recognized through the hydrogen annealing.

Example 6

First of all, a silicon base was prepared as the substrate portion 11. By the sputtering method, a first layer for the bottom electrode made of $Ir_{92}Hf_8$ (atom %) with a thickness of 20 nm, a second layer for the bottom electrode made of iridium with a thickness of 20 nm, a third layer for the bottom electrode made of $Ir_dHf_eO_f$ with a thickness of 100 nm, and a fourth layer for the bottom electrode made of iridium with a thickness of 20 nm were sequentially deposited and stacked thereon (see Step S201, FIG. 9).

Next, a dielectric antecedent film mainly including SBT was deposited in the same manner as the first example (see Step S202, FIG. 9). RTA was performed under the following condition:

[RTA Condition]

Atmosphere gas: mixed gas of nitrogen gas and oxygen gas; nitrogen gas-oxygen gas ratio (volume ratio): $N_2:O_2=4:1$ Speed of temperature increase: 740° C./10 sec.

Maximum temperature achieved: 740° C.

Maximum temperature retaining time: 30 sec.

Further, the reduction thermal annealing was performed each time after RTA under the following condition, and the oxide was reduced, the oxide being considered to be generated in a part of the first, second, third and fourth layers for the bottom electrode through the oxygen thermal annealing (see Step S232, FIG. 9). After the dielectric antecedent film was deposited in this way, the surface characteristic was observed through SEM. It was observed that the dielectric antecedent film was amorphous, and the surface characteristic was favorable. Furthermore, when identification analysis was performed using X-ray diffraction, the existence of iridium oxide ($IrO_2$) was not recognized.

Then, the oxygen thermal annealing was performed thereon at a temperature of 450° C. in an oxygen atmosphere for 30 minutes, to add oxygen to the dielectric antecedent film (see Step S232, FIG. 9). After the oxygen thermal annealing, by the sputtering method, a second layer for the top electrode made of iridium with a thickness of 20 nm, and a first layer for the top electrode made of $Ir_dHf_eO_c$ with a thickness of 200 nm were sequentially deposited and stacked on the dielectric antecedent film (see Step S233, FIG. 9).

Then, the pre-thermal annealing was performed thereon at a temperature of 750° C. in a nitrogen atmosphere for 30 minutes (see Step S235, FIG. 9), and, again, the reduction thermal annealing was performed thereon under the same condition as that of the earlier reduction thermal annealing (see Step S236, FIG. 9). After the reduction thermal annealing, the inert gas thermal annealing was performed thereon at a temperature of 750° C. in a nitrogen atmosphere for one hour (see Step S237, FIG. 9). Here, again, when the dielectric antecedent film was observed through SEM, the grain of the dielectric antecedent film was grown up to on the order of 100 nm in size. After that, films such as the dielectric antecedent film was processed by etching to obtain the dielectric capacitor 40.

The ferroelectric characteristics were measured in regard to the dielectric capacitor 40 in the same manner as the first example. Also, the ferroelectric characteristics after the hydrogen annealing were measured in the same manner as the third example. The manufacturing condition and the measurement results for the dielectric capacitor 40 are shown in Table 2 and 3. The Table 2 and 3 provides favorable values of 18 $\mu C/cm^2$ for the dielectric polarization value 2 Pr and 2.0 V for the coercive voltage 2 Vc, before and after the hydrogen annealing, and the deterioration due to the hydrogen annealing was not recognized.

As a comparative example (Comparative Example 2) for the fifth example, a dielectric capacitor was manufactured under the same condition as that of the fifth example except that the top electrode was formed of platinum. However, in the stage when a layer for the top electrode was deposited with platinum, followed by the pre-thermal annealing performed thereon and, then, reduction thermal annealing performed thereon, bubbling and blistering occurred on the surface of the platinum layer. Thus, a favorable dielectric capacitor could not be obtained.

Example 7

A dielectric capacitor 40 was manufactured under the same condition as that of the sixth example except that the second and the first layer for the top electrode were deposited, respectively, and, then, processed by etching before the pre-thermal-annealing was performed (see Step S234, FIG. 9). As a result, the same favorable dielectric capacitor 40 as that in the sixth example was obtained.

While the first through seventh examples are described with reference to specific examples, the same results can be obtained as those of the first through seventh examples described above by using the dielectric capacitors 10 and 40 according to the present invention. For example, if the top electrode 14 is formed of the oxygen inclusion material $M_{Ia}M_{IIb}O_c$, favorable characteristics can be obtained even when the thermal annealing was performed in an inert gas atmosphere after deposition. Further, the dielectric capacitor can be obtained whose characteristics are not deteriorated through the hydrogen annealing. Also, the dielectric capacitor can be deposited and processed by etching before crystallizing or crystal growing the dielectric antecedent film, which allows microfabrication.

While the present invention is described with reference to embodiments and examples, the present invention is not limited to those embodiments and examples, and various modifications are possible. For example, in the embodiments and examples described above, while the top electrode 14 is composed of the oxygen inclusion layer 14a, or the oxygen inclusion layer 14a and the precious metal layer 14b, the top electrode 14 may include other layers.

Further, in the embodiments and examples described above, while the constructions of the bottom electrodes 12 and 42 are described with reference to specific examples, the present invention may be applied to the case where the bottom electrode has other constructions.

Still further, in the embodiments and examples above, while described is a case where the dielectric film 13 is composed of the ferroelectric including the layer structure oxide containing bismuth, the present invention may be applied to the case where the dielectric film is composed of other ferroelectric including PZT or the like, and the same effect can be obtained.

In addition, the present invention may be also applied to the case where the dielectric film is composed of a high dielectric, and the same effects can be obtained. Such a high dielectric includes oxide consisting of oxygen and two or more elements selected from the group consisting of, for example, magnesium (Mg), calcium, strontium, and barium as the IIa family element, titanium and zirconium as the IVa family element, niobium and tantalum as the Va family element, lead (Pb) and tin (Sn) as the IVb family element, and bismuth as the Vb family element. In particular, the oxide is preferably composed of a first element A, which is at least one selected from a group consisting of magnesium, calcium, strontium and barium in the IIa family element and lead of the IVb family element, a second element B, which is at least one selected from a group consisting of titanium and zirconium in the IVa family element and tin in the IVb family element, and oxygen. Its composition formula is preferably expressed by $ABO_3$ so that excellent characteristics can be obtained.

Further, in the embodiments and examples above, while the dielectric film is formed by the so-gel method, the dielectric film may be formed by other methods such as the MOCVD (metal organic chemical vapor deposition) method, the laser abrasion method, the MOD (metal organic decomposition) method or the sputtering method.

In addition, in the embodiments and examples above, in forming the dielectric film 13, when the oxygen thermal annealing is performed and, then the inert gas thermal annealing is performed at a temperature equal to or higher than the temperature for the oxygen thermal annealing in order to improve characteristics of the dielectric film 13, crystals of the dielectric antecedent film are also grown through the inert gas thermal annealing. However, the inert gas thermal annealing does not need to be the thermal annealing for crystal growth. Further, when the oxygen thermal annealing is performed and, then, the reduction thermal annealing is performed in order to improve characteristics of the dielectric film 13, the reduction thermal annealing is performed before crystal growth in the dielectric antecedent film. However, reduction thermal annealing may be performed after the crystals have been grown.

Still further, in the embodiments described above, described is the memory in which the dielectric capacitor 10 or 40 and the transistor 20 are formed perpendicular to the base 21. However, the present invention may be applied to a memory in which the dielectric capacitor 10 or 40 and the transistor 20 are formed in line in a direction parallel to the base 21.

Furthermore, in the embodiments described above, while the case where the dielectric capacitors 10 and 40 are used for one memory, the present invention may also be applied to an LSI (large-scale integrated circuit) memory in which a plurality of memories are integrated.

As described above, according to the dielectric capacitor of the present invention, since there is provided the second electrode oxygen inclusion layer which includes the oxygen inclusion material $M_{Ia}M_{IIb}O_c$ in the second electrode, microfabrication of the second electrode becomes easier, enhancing the possibility of scaling down the device. Further, favorable characteristics can be obtained even when the thermal annealing is performed in an inert gas atmosphere when forming the second electrode. Therefore, performing the inert gas thermal annealing and the reduction thermal annealing can prevent deterioration of characteristics caused by the hydrogen annealing for recovering the function of the transistor. Further, favorable characteristics can be obtained even when the second electrode is deposited before the crystallization or crystal growth of the dielectric film has occurred. Accordingly, microfabrication becomes easier at the time of etching.

Specifically, according to the dielectric capacitor of the present invention, less uneven, stable characteristics can be obtained by providing the second electrode precious metal layer between the second electrode oxygen inclusion layer and the dielectric film.

According to the dielectric capacitor of the present invention, by providing the first electrode oxygen inclusion layer including the oxygen inclusion material $M_{IIId}M_{IVe}O_f$ in the first electrode, the element diffusion can be prevented between the substrate portion and the dielectric film, and the characteristics can be improved. Further, microfabrication of the first electrode can be made easier.

According to the dielectric capacitor of the present invention, by providing the first precious metal layer between the first electrode oxygen inclusion layer and the adhesive layer, adhesion of the first electrode can be maintained even if the inert gas thermal annealing or reduction thermal annealing is performed in order to improve the characteristics of the dielectric film.

According to the dielectric capacitor of the present invention, the adhesive layer is composed so as to include alloy $M_{Vg}MV_{Ih}$. Thus, the first electrode oxygen inclusion layer and the first electrode precious metal layer can achieve commonality of composition elements, which can improve productivity.

Further, according to the dielectric capacitor of the present invention, by providing another first electrode precious metal layer between the first electrode oxygen inclusion layer and the dielectric film, the characteristics of the dielectric film can be improved The memory according to the present invention comprises the dielectric capacitor of the invention. Therefore, favorable characteristic can be obtained, and also the microfabrication becomes easier, which improves the possibility of scaling down the device.

Furthermore, according to the method of manufacturing the dielectric capacitor of the present invention, the first layer for the second electrode is deposited using the oxygen inclusion material $M_{Ia}M_{IIb}O_c$. Thus, the microfabrication of the second electrode becomes easier, which improves the possibility of scaling down the device According to the method of manufacturing the dielectric capacitor of the invention, at the time of forming the dielectric film, the oxygen thermal annealing is performed and, then, inert gas thermal annealing is performed at a temperature equal to or higher than the temperature in the oxygen thermal annealing. Alternatively, in the oxygen thermal annealing, the oxide generated in a part of the first, second, and third layers for first electrode is reduced. By this process, deterioration in the characteristics of the dielectric film caused by the hydrogen annealing can be prevented.

According to the method of manufacturing the dielectric capacitor of the present invention, the dielectric antecedent film is deposited, and then, the first layer for the second electrode is deposited before crystallizing or crystal growing the dielectric antecedent film. By this process, the first layer for the second electrode can be deposited on the smooth surface, and the first layer for the second electrode and the dielectric antecedent film can be processed by etching, which allows easier microfabrication.

The method of manufacturing the memory according to the present invention includes the steps of manufacturing the dielectric capacitor of the present invention. Thus, the microfabrication becomes easier, which improves the possibility of scaling down the device.

Obviously many modifications and variations of the present invention are possible in the light of the above teachings. It is therefore to be understood that within the scope of the appended claims the invention may be practiced otherwise than as specifically described.

What is claimed is:

1. A dielectric capacitor which is supported by a substrate portion and in which a first electrode, a dielectric film and a second electrode are formed sequentially on the substrate portion, the second electrode comprising:

a second electrode oxygen inclusion layer including an oxygen inclusion material made of at least one selected from a precious metal element group consisting of platinum (Pt), iridium (Ir), ruthenium (Ru), rhodium (Rh) and palladium (Pd), at least one selected from a transition metal element group consisting of hafnium (Hf), tantalum (Ta), zirconium (Zr), niobium (Nb), vanadium (V), molybdenum (Mo), tungsten (W) and a rare-earth element, and oxygen (O), wherein the composition formula of the oxygen inclusion material is expressed by $M_{Ia}M_{IIb}O_c$, where an element in the precious metal element group is $M_I$ and an element in the transition metal element group is $M_{II}$ and its composition range is $90 \geq a \geq 4$, $15 \geq b \geq 2$, $c \geq 4$, $a+b+c=100$ in atom %.

2. A dielectric capacitor according to claim 1, wherein the second electrode further comprises a second electrode precious metal layer including at least one selected from the precious metal element group, which is provided between the second electrode oxygen inclusion layer and the dielectric film.

3. A dielectric capacitor according to claim 1, wherein the first electrode comprises a first electrode oxygen inclusion layer including an oxygen inclusion material made of at least one selected from the precious metal element group, at least one selected from the transition metal element group and oxygen, and the composition formula of the oxygen inclusion material is expressed by $M_{IIId}M_{IVe}O_f$, where an element in the precious metal element group is $M_{III}$ and an element in the transition metal element group is $M_{IV}$, and its composition range is $90 \geq d \geq 4$, $15 \geq e \geq 2$, $f \geq 4$, $d+e+f=100$ in atom %.

4. A dielectric capacitor according to claim 3, wherein the first electrode further comprises:

a first electrode precious metal layer which is provided between the first electrode oxygen inclusion layer and the substrate portion, the first electrode precious metal layer including at least one selected from the precious metal element group, and an adhesive layer which is provided between the first electrode precious metal layer and the substrate portion.

5. A dielectric capacitor according to claim 4, wherein the adhesive layer includes an alloy consisting of at least one selected from the precious metal element group and at least one selected from the transition metal element group, and the composition formula of the alloy is expressed by $M_{Vg}M_{VIIh}$, where an element from the precious metal element group is $M_V$ and an element from the transition metal element group is $M_{VI}$, and its composition range is $97 \geq g \geq 90$, $10 \geq h \geq 3$, $g+h=100$ in atom %.

6. A dielectric capacitor according to claim 4, wherein the adhesive layer includes at least one selected from a group consisting of titanium (Ti), zirconium, hafnium, tantalum, niobium, chromium (Cr), molybdenum and tungsten.

7. A dielectric capacitor according to claim 3, wherein the first electrode further includes another first electrode precious metal layer including at least one selected from the precious metal element group, which is provided between the dielectric film and the first electrode oxygen inclusion layer.

8. A dielectric capacitor according to claim 1, wherein the dielectric film is composed of a ferroelectric including layer structure oxide containing bismuth (Bi).

9. A dielectric capacitor according to claim 1, wherein the dielectric film includes layer structure oxide consisting of bismuth, at least one selected from a group consisting of strontium (Sr), calcium (Ca) and barium (Ba), at least one selected from a group consisting of tantalum and niobium, and oxygen (O), and the composition formula of the layer structure oxide is expressed by $Bi_x(Sr, Ca, Ba)_y (Ta, Nb)_2O_{9+z}$, and its composition range is $2.50 \geq x \geq 1.70$, $1.20 \geq y \geq 0.60$, $-1.00 \geq z \geq 1.00$ in mole ratio.

10. A dielectric capacitor according to claim 9, wherein the layer structure oxide is expressed by the composition formula, $Bi_x Sr_y Ta_2O_{9+z}$, and its composition range is $2.50 \geq x \geq 1.70$, $1.20 \geq y \geq 0.60$, $-1.00 \geq z \geq 1.00$ in mole ratio.

11. A memory comprising:

a dielectric capacitor which is supported by a substrate portion and in which a first electrode, a dielectric film and a second electrode are formed sequentially on the substrate portion, the second electrode having, a second electrode oxygen inclusion layer including an oxygen inclusion material, made of at least one selected from a precious metal element group consisting of platinum (Pt), iridium (Ir), ruthenium (Ru), rhodium (Rh) and palladium (Pd), at least one selected from a transition metal element group consisting of hafnium (Hf), tantalum (Ta), zirconium (Zr), niobium (Nb), vanadium (V), molybdenum (Mo), tungsten (W) and a rare-earth element, and oxygen (O), wherein the composition formula of the oxygen inclusion material is expressed by $M_{Ia}M_{IIb}O_c$, where an element in the precious metal element group is $M_I$ and an element in the transition metal element group is $M_{II}$, and its composition range is $90 \geq a \geq 4$, $15 \geq b \geq 2$, $c \geq 4$, $a+b+c=100$ in atom %.

12. A memory according to claim 11, further comprising a transistor which is connected to the first electrode through a plug layer comprising at least part of the substrate portion.

13. A method of manufacturing a dielectric capacitor which is supported by a substrate portion and in which a first electrode, a dielectric film and a second electrode are formed sequentially on the substrate portion, wherein the step of forming the second electrode includes, a step of depositing a first layer for the second electrode by using an oxygen inclusion material made of at least one selected from a precious metal element group consisting of platinum (Pt), iridium (Ir), ruthenium (Ru), rhodium (Rh) and palladium (Pd), at least one selected from a transition metal element group consisting of hafnium (Hf), tantalum (Ta), zirconium (Zr), niobium (Nb), vanadium (V), molybdenum (Mo), tungsten (W) and a rare-earth element, and oxygen (O), wherein the oxygen inclusion material is expressed by the composition formula, $M_{Ia}M_{IIb}O_c$, where an element in the precious metal element group is $M_I$ and an element in the transition metal element group is $M_{II}$, and its composition range is $90 \geq a \geq 4$, $15 \geq b \geq 2$, $c \geq 4$, $a+b+c=100$ in atom %.

14. A method of manufacturing a dielectric capacitor according to claim 13, wherein the step of forming the second electrode further includes the steps of, depositing a second layer for the second electrode by using at least one selected from the precious metal element group before depositing the first layer for the second electrode, and depositing the first layer for the second electrode on the second layer.

15. A method of manufacturing a dielectric capacitor according to claim 13, the dielectric capacitor including an adhesive layer in the first electrode, wherein the step of forming the first electrode further includes the steps of, depositing a first layer for the first electrode, which is to construct the adhesive layer, on the substrate portion, depositing a second layer for the first electrode by using at least one selected from the precious metal element group on the first layer for the first electrode, and depositing a third layer for the first electrode on the second layer for the first electrode by using an oxygen inclusion material made of at least one selected from the precious metal element group, at least one selected from the transition metal element group and oxygen, the oxygen inclusion material being expressed by the composition formula, $M_{IIId}M_{IVe}O_f$, where an element in the precious metal element group is $M_{III}$ and an element in the transition metal element group is $M_{IV}$, and its composition range being $90 \geq d \geq 4$, $15 \geq e \geq 2$, $f \geq 4$, $d+e+f=100$ in atom %.

16. A method of manufacturing a dielectric capacitor according to claim 15, wherein the step of forming a dielectric film includes the steps of, performing oxygen thermal annealing in an oxygen inclusion atmosphere, and performing inert gas thermal annealing in an inert gas atmosphere at a temperature equal to or higher than that in the oxygen thermal annealing after the oxygen thermal annealing.

17. A method of manufacturing a dielectric capacitor according to claim 15, wherein the step of forming a dielectric film includes the steps of, performing oxygen thermal annealing in an oxygen inclusion atmosphere, and reducing oxide generated in a part of the first layer, the second layer and the third layer for the first electrode in the oxygen thermal annealing after the oxygen thermal annealing.

18. A method of manufacturing a dielectric capacitor according to claim 17, wherein the step of forming the dielectric film further includes a step of performing inert gas thermal annealing in an inert gas atmosphere after the reduction.

19. A method of manufacturing a dielectric capacitor according to claim 18, wherein the step of forming the dielectric film still further includes a step of performing another oxygen thermal annealing in an oxygen inclusion atmosphere at a temperature lower than a temperature at which a substance reduced in the reduction oxidizes prior to the inert gas thermal annealing after the reduction.

20. A method of manufacturing a dielectric capacitor according to claim 13, wherein the step of forming the dielectric film includes the steps of, depositing an amorphous or microlite dielectric antecedent film and, then, crystallizing or crystal growing the dielectric antecedent film, and depositing the first layer for the second electrode on the dielectric antecedent film before crystallizing or crystal growing the dielectric antecedent film after the step of depositing the dielectric antecedent film.

21. A method of manufacturing a dielectric capacitor according to claim 20, wherein the first layer for the second electrode, and the dielectric antecedent film are processed by etching before crystallizing or crystal growing the dielectric antecedent film after the step of depositing the first layer for the second electrode.

22. A method of manufacturing a memory, the memory having a dielectric capacitor which is supported by a substrate portion and in which a first electrode, a dielectric film and a second electrode are formed sequentially on the substrate portion, the step of forming the second electrode comprising:

a step of depositing a first layer for the second electrode using an oxygen inclusion material made of at least one selected from a precious metal element group consisting of platinum (Pt), iridium (Ir), ruthenium (Ru), rhodium (Rh) and palladium (Pd), at least one selected from a transition metal element group consisting of hafnium (Hf), tantalum (Ta), zirconium (Zr), niobium (Nb), vanadium (V), molybdenum (Mo), tungsten (W) and a rare-earth element, and oxygen (O), the oxygen inclusion material being expressed by the composition formula, $M_{Ia}M_{IIb}O_c$, where an element in the precious metal element group is $M_I$ and an element in the transition metal element group is $M_{II}$ and its composition range being $90 \geq a \geq 4$, $15 \geq b \geq 2$, $c \geq 4$, $a+b+c=100$ in atom %.

23. A method of manufacturing a memory according to claim 22, the memory including an adhesive layer in the first electrode, in which a transistor is connected to the dielectric capacitor through a plug layer comprising at least part of the substrate portion, wherein the step of forming the first electrode includes the steps of, depositing a first layer for the first electrode, which is to construct the adhesive layer, on the substrate portion, depositing a second layer for the first electrode by using at least one selected from the precious metal element group on the first layer, and depositing a third layer for the first electrode on the second layer by using an oxygen inclusion material made of at least one selected from the precious metal element group, at least one selected from the transition metal element group and oxygen, the oxygen inclusion material being expressed by the composition formula, $M_{IIId}M_{IVe}O_f$, where an element in the precious metal element group is $M_{III}$ and an element in the transition metal element group is $M_{IV}$, and its composition range being $90 \geq d \geq 4$, $15 \geq e \geq 2$, $f \geq 4$, $d+e+f=100$ in atom %, and the step of forming the dielectric film includes the steps of, performing oxygen thermal annealing in an oxygen inclusion atmosphere and, then, performing inert gas thermal annealing in an inert gas atmosphere at a temperature equal to or higher than the temperature in the oxygen thermal annealing, and performing hydrogen annealing in a hydrogen inclusion atmosphere in order to recover a function of the transistor after the inert gas thermal annealing.

24. A method of manufacturing a memory according to claim 22, the memory including an adhesive layer in the first electrode, in which a transistor is connected to the dielectric capacitor through a plug layer comprising at least part of the substrate, wherein the step of forming the first electrode includes the steps of, depositing a first layer for the first electrode, which is to construct the adhesive layer, on the substrate portion, depositing a second layer for the first electrode by using at least one selected from the precious metal element group on the first layer, and depositing a third layer for the first electrode on the second layer by using an oxygen inclusion material made of at least one selected from the precious metal element group, at least one selected from the transition metal element group and oxygen, the oxygen inclusion material being expressed by the composition formula, $M_{IIId}M_{IVe}O_f$, where an element in the precious metal element group is $M_{III}$ and an element in the transition metal element group is $M_{IV}$, and its composition range being $90 \geq d \geq 4$, $15 \geq e \geq 2$, $f \geq 4$, $d+e+f=100$ in atom %, and the step of forming the dielectric film includes the steps of, performing oxygen thermal annealing in an oxygen inclusion atmosphere and, then, reducing oxide generated in part of the first layer, the second layer and the third layer for the first electrode in the oxygen thermal annealing, and performing hydrogen annealing in a hydrogen inclusion atmosphere in order to recover a function of the transistor after the reduction.

25. A method of manufacturing a memory according to claim 22, wherein the step of forming the dielectric film includes the steps of, forming an amorphous or microlite dielectric antecedent film and, then, crystallizing or crystal growing the dielectric antecedent film by thermal annealing, and depositing the first layer for the second electrode on the dielectric antecedent film before crystallizing or crystal growing the dielectric antecedent film after depositing the dielectric antecedent film.

* * * * *